(12) United States Patent
Ohsawa et al.

(10) Patent No.: US 7,931,976 B2
(45) Date of Patent: Apr. 26, 2011

(54) MAGNETIC RECORDING ELEMENT

(75) Inventors: Yuichi Ohsawa, Kanagawa-ken (JP);
Shiho Nakamura, Kanagawa-ken (JP);
Hirofumi Morise, Kanagawa-ken (JP);
Satoshi Yanagi, Kanagawa-ken (JP);
Daisuke Saida, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 200 days.

(21) Appl. No.: 12/285,429

(22) Filed: Oct. 3, 2008

(65) Prior Publication Data
US 2009/0098412 A1 Apr. 16, 2009

(30) Foreign Application Priority Data
Oct. 5, 2007 (JP) .................................. 2007-262575

(51) Int. Cl.
*G11B 5/39* (2006.01)
*G01B 7/14* (2006.01)
*G01B 7/24* (2006.01)

(52) U.S. Cl. ............. 428/811.2; 428/811.5; 360/324.11; 360/324.12; 365/158; 365/209; 324/207.21

(58) Field of Classification Search .................. None
See application file for complete search history.

(56) References Cited

U.S. PATENT DOCUMENTS

| | | | | |
|---|---|---|---|---|
| 5,686,838 A | * | 11/1997 | van den Berg | 324/252 |
| 6,031,372 A | * | 2/2000 | Van Den Berg | 324/252 |
| 6,636,396 B1 | * | 10/2003 | Gill | 360/324.12 |
| 6,956,766 B2 | | 10/2005 | Nakamura et al. | |
| 7,120,049 B2 | | 10/2006 | Nakamura et al. | |
| 7,126,848 B2 | | 10/2006 | Nakamura et al. | |
| 7,126,849 B2 | | 10/2006 | Nakamura et al. | |
| 7,253,994 B2 | * | 8/2007 | Kagami et al. | 360/324.1 |
| 7,372,727 B2 | | 5/2008 | Nakamura et al. | |
| 7,599,151 B2 | * | 10/2009 | Hatatani et al. | 360/319 |

(Continued)

FOREIGN PATENT DOCUMENTS
JP 2004-193595 7/2004

OTHER PUBLICATIONS
Albert, F. J., et al., "Spin-polarized current switching of a Co thin film nanomagnet", Applied Physics Letters, vol. 77, No. 23, pp. 3809-3811, (Dec. 4, 2000).

*Primary Examiner* — Kevin M Bernatz
(74) *Attorney, Agent, or Firm* — Nixon & Vanderhye, PC

(57) ABSTRACT

A magnetic recording element includes a multilayer having a surface and a pair of electrodes. The multilayer has a first magnetic fixed layer whose magnetization is substantially fixed in a first direction substantially perpendicular to the surface. The multilayer also has a second magnetic fixed layer whose magnetization is substantially fixed in a second direction opposite to the first direction substantially perpendicular to the surface. A third magnetic layer is provided between the first and second magnetic layers. The direction of magnetization of the third ferromagnetic layer is variable. A first intermediate layer is provided between the first and the third magnetic layers. A second intermediate layer is provided between the second and the third magnetic layers. The pair of electrodes is capable of supplying an electric current flowing in a direction substantially perpendicular to the surface to the multilayer. The sectional area taken parallel to the surface at a thickness midpoint of the first magnetic layer is larger than that of the second magnetic layer.

12 Claims, 16 Drawing Sheets

U.S. PATENT DOCUMENTS

| | | |
|---|---|---|
| 7,768,747 B2 * | 8/2010 | Kagami et al. ............... 360/319 |
| 2002/0030947 A1 * | 3/2002 | Chen et al. ................... 360/319 |
| 2004/0165425 A1 * | 8/2004 | Nakamura et al. ........... 365/171 |
| 2005/0237677 A1 * | 10/2005 | Shimazawa et al. ..... 360/324.12 |
| 2007/0091513 A1 * | 4/2007 | Sbiaa et al. .............. 360/324.11 |
| 2007/0217077 A1 * | 9/2007 | Kanaya et al. ................ 360/313 |
| 2008/0253036 A1 * | 10/2008 | Kagami et al. ............... 360/319 |

* cited by examiner

- $S_U < 0.7\ S_L$
- $S_U < 2000\ nm^2$

MAGNETIC RECORDING ELEMENT

CROSS REFERENCE TO RELATED APPLICATION

This application is based upon and claims the benefit of priority from the prior Japanese Patent Application No. 2007-262575, filed on Oct. 5, 2007, the entire contents of which are incorporated herein by reference.

FIELD OF THE INVENTION

The present invention relates to a magnetic recording element, a manufacturing method of the same and magnetic storage system, more particularly to a magnetic recording element capable of executing a write-in by supplying spin-polarized electrons, and a magnetic storage system using the same.

DESCRIPTION OF THE BACKGROUND

In recent years, spin-electronic devices utilizing a spin-polarized electron have been studied worldwide. In, e.g., a hard disk drive, the magnetization direction of the medium is reversed by a magnetic field generated from the magnetic head to execute a write-in. In a magnetic random access memory, an electric current magnetic field totally generated by supplying currents to two write-in lines is applied to a cell to control its magnetization direction. These magnetization direction control methods utilizing an external magnetic field have a long history and are regarded as established techniques.

On the other hand, along with the recent progress in nano-technology, bit or cell size of magneto-resistance devices has been reduced. Accordingly, magnetization control must locally be done on a nanoscale.

However, localization of the magnetic field is difficult, because a magnetic field fundamentally spreads spatially. This causes the problem of "cross talk". That is, even when a specific bit or cell is selected to control its magnetization direction, the magnetic field spreads to adjacent bits or cells and executes an incorrect write-in on them. If the magnetic field generation source is made small to localize the magnetic field, no sufficient magnetic field can be generated.

Then, a "current direct driving magnetization reversal method" to avoid the problem has come to attract attention (e.g., F. J. Albert, et al., Appl. Phy. Lett. 77, 3809 (2000)). In this method, an electric current is supplied to a magnetic layer of a magneto-resistive effect element to spin-polarize electrons. The spin-polarized electrons are caused to pass through the target magnetic layer to reverse its magnetization. More specifically, when the angular momentum of the spin-polarized electrons is transmitted to and acts on the angular momentum of the magnetic materials whose magnetization is to be reversed, the magnetization direction of the magnetic material is reversed.

When this method is employed, the current can be caused to more directly act on a magnetic material on a nanoscale, as compared with the above-described current magnetic field write-in methods. The current necessary for magnetization reversal can be caused to also reduce fundamentally according to the miniaturization of the magneto-resistive effect element. Hence, this technique of "spin injection magnetization reversal" contributes to realizing spin electronics devices such as high-density hard disks or MRAMs.

The magnetic recording element was proposed in JP-A 2004-193595 (Kokai). The magnetic recording element is formed with a multilayer to reduce the current density for "direct-current-driving magnetization reversal." The multilayer is formed with two magnetically fixed layers whose magnetization directions are anti-parallel, and includes a magnetic recording layer whose magnetization direction is variable. Further, the multilayer includes intermediate layers provided between the magnetic recording layer and the magnetically fixed layers.

SUMMARY OF THE INVENTION

An advantage of aspects of the invention is to provide a magnetic recording element which operates stably and is manufactured easily and the method of manufacturing the same.

To achieve the above advantage, an aspect of the invention is to provide a magnetic recording element comprising a multilayer having a surface and a pair of electrodes. The multilayer includes a first magnetic layer whose magnetization is substantially fixed in a first direction substantially perpendicular to the surface, a second magnetic layer whose magnetization is substantially fixed in a second direction opposite to the first direction substantially perpendicular to the surface, a third magnetic layer provided between the first and the second magnetic layers, a direction of magnetization of the third magnetic layer being variable, a first intermediate layer provided between the first and the third ferromagnetic layers and a second intermediate layer provided between the second and the third magnetic layers, wherein the pair of electrodes are capable of supplying an electric current to flow in a direction substantially perpendicular to the surface of the multilayer, and the sectional area of the first magnetic layer taken parallel to the surface at the thickness midpoint is larger than the sectional area of the second magnetic layer taken parallel to the surface at the thickness midpoint.

To achieve the above advantage, other aspect of the invention is to provide a method of manufacturing a magnetic recording element comprising providing a multilayer and processing and patterning the multilayer. The multilayer has a first magnetic layer, a second magnetic layer, a third magnetic layer provided between the first and the second magnetic layers, a first intermediate layer provided between the first and the third magnetic layers and a second intermediate layer provided between the second and the third magnetic layers. Processing and patterning the multilayer are done such that the volume ratio of a sidewall portion of the first magnetic layer magnetically softer than the inside portion is different from the volume ratio of a sidewall portion of the second magnetic layer magnetically softer than the inside portion.

To achieve the above advantage, other aspect of the invention is to provide a method of manufacturing a magnetic recording element comprising providing a multilayer, patterning the multilayer and providing the multilayer with a specific sidewall portion. The multilayer has a first magnetic layer, a second magnetic layer, a third magnetic layer provided between the first and the second magnetic layers, a first intermediate layer provided between the first and the third magnetic layers, a second intermediate layer provided between the second and the third magnetic layers. The specific sidewall portion is a sidewall portion magnetically softer than an inside in at least one of the first and second magnetic layers.

To achieve the above advantage, other aspect of the invention is to provide a magnetic storage system comprising the element, an electric current source to supply an electric current to the element, an electric current path leading the current to the element.

DETAILED DESCRIPTION OF THE INVENTION

Figure 1:
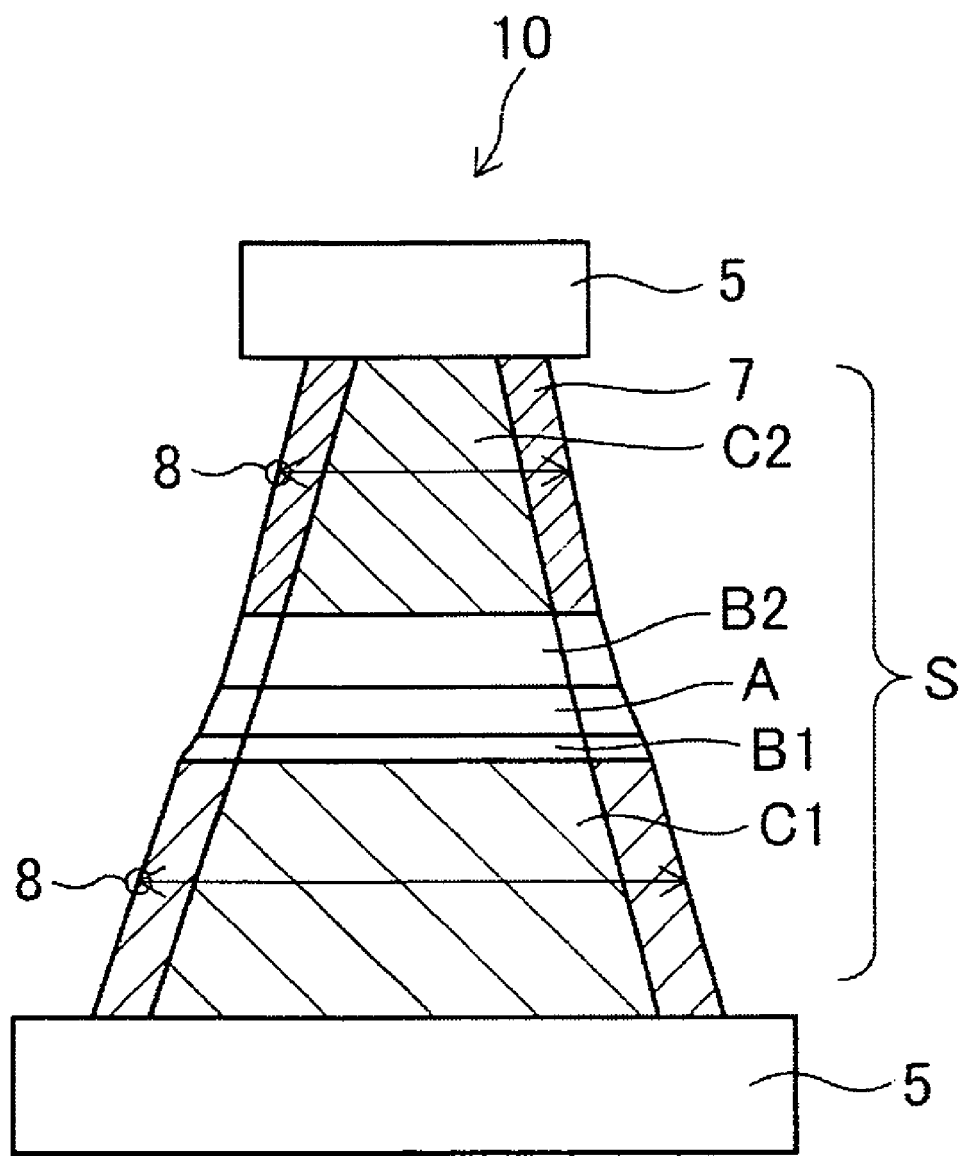
FIG. 1 is a schematic view showing the sectional structure of a magnetic recording element according to the this embodiment of the invention.

The embodiments of the present invention will be described below with reference to the accompanying drawing. The same reference numerals denote the same parts throughout the drawing.

Embodiment

FIG. 1 is a schematic view showing the sectional structure of a magnetic recording element according to the embodiment of the invention.

As shown in FIG. 1, a magnetic recording element 10 has a multilayer S and a pair of electrodes 5 and 5 sandwiching the structure S and thus enabling us to pass an electric current perpendicularly to the surface of the multilayer S. The multilayer S has a first magnetic layer, first intermediate layer, third magnetic layer, second intermediate layer and second magnetic layer sequentially laminated in this order, for example. Here, the first and second magnetic layers are referred to as the fixed layers C1 and C2, respectively. The first and second intermediate layers are also referred to as the intermediate layers B1 and B2, respectively. The third magnetic layer is also referred to as the recording layer A. The fixed layers C1 and C2 are magnetic layers whose magnetizations are fixed such that the magnetization directions are anti-parallel. The recording layer A is a magnetic layer whose magnetization direction is variable. The intermediate layers B1 and B2 comprise nonmagnetic materials, for example.

It is preferable that directions of an easy axis of magnetization of the recording layer A may be perpendicular to the surface (the principal film surface). A magnetic film with such a magnetic structure is called a "perpendicular magnetization film" etc. On the other hand, a magnetic layer whose easy axis of magnetization is substantially parallel to the surface is called an "in-plane magnetization film."

The perpendicular magnetization film is easier to miniaturize, and has a lower reversal current density than the in-plane magnetization film for spin-polarized current injections. It is only necessary to set a relationship between the saturation magnetization $M_s$ (emu/cc) and the anisotropy field $H_{an}$ (Oe) of a magnetic material of the recording layer A to $H_{an} > 12.57 M_s$ in order to orient the easy axis of the recording layer A perpendicularly to the surface. The anisotropy field $H_{an}$ is given by $H_{an} = 2K_u/M_s$ using the magnetic anisotropy energy $K_u$ with a direction perpendicular to the surface.

The multilayer S is formed in a shape tapering from the bottom layer toward the top layer therein. Patterning into a cellar shape also provides the sidewall of the multilayer S with the damage zone 7. The "multilayer S" will be referred to as the "cell" in some cases in the detailed description of the invention.

According to this embodiment, providing the multilayer S in a tapered shape can taper sectional areas parallel to the surface of the multilayer S from the lower fixed layer C1 toward the upper one C2. In addition, providing the damaged zones 7 with the sidewalls of the fixed layers C1 and C2 can differentiate the coercive forces of the upper and lower fixed layers C1 and C2. Specifically, the coercive force of the fixed layer C2 with a smaller cross-section can be made smaller than that of the fixed layer C1 with a larger cross-section. This is because an influence of the damage zone 7 provided to the sidewalls of the lower and upper fixed layers C1 and C2 on their magnetic properties differs when these fixed layers have different cross-sections, as described in full detail below.

Thus, differentiating the coercive forces of the lower and upper fixed layers C1 and C2 will ease fixing the magnetizations of the fixed layers C1 and C2 in mutually opposite directions in a magnetization fixing. Specifically, the magnetization of the fixed layer C1 with a higher coercive force is first fixed by applying a stronger magnetic field in a first direction, for example. Then, applying a weaker magnetic field in a second direction opposite to the first direction can pin the magnetization of the fixed layer C2 with a lower coercive force.

Therefore, the magnetization of the fixed layer C1 may not be reversed in the 2nd direction even when applying the weaker magnetic field in the 2nd direction.

Even using the same magnetic material for the fixed layers C1 and C2 can provide a significant difference between the coercive forces of the fixed layers C1 and C2, according to this embodiment. This eases fixing the magnetizations of the fixed layers C1 and C2 in the directions opposite to each other, thus providing magnetic recording elements producible easily.

The operation of the magnetic recording element of this embodiment will be described below.

The "magnetic recording element" will be referred to as the "recording element" below in the detailed description of the invention.

Figure 2:
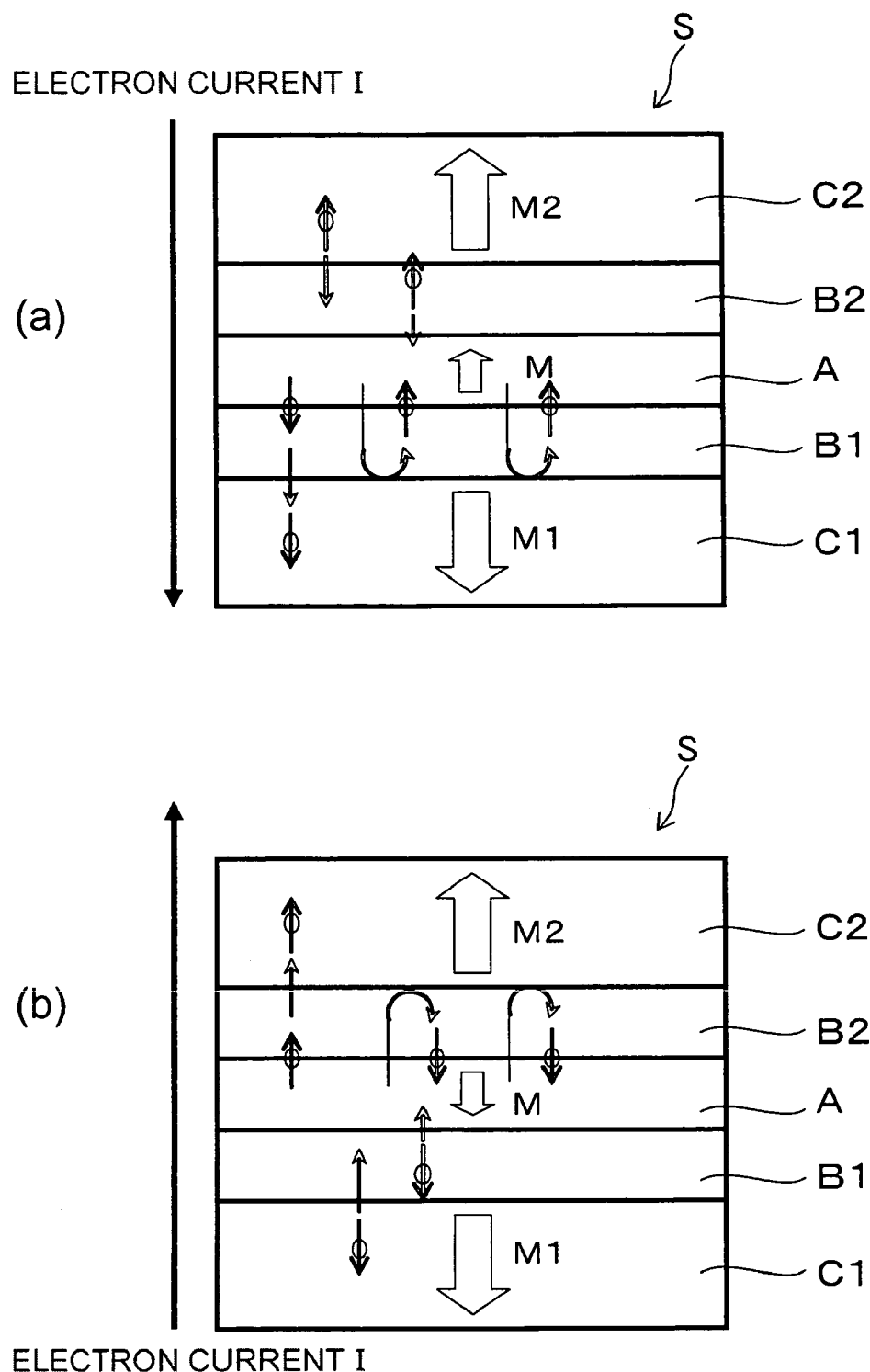
FIG. 2 is a schematic view for explaining a write-in mechanism of the magnetic recording element according to this embodiment of the invention.

FIG. 2 is a schematic view showing the write-in mechanism of the recording element 10 according to this embodiment. The same reference numerals denote the same parts throughout all the drawings including FIG. 2. The multilayer S is drawn not as a tapered cell but as a cell with a sidewall perpendicular to the surface in FIG. 2 for simplicity. In this example, the magnetization M1 of the fixed layer C1 is fixed downward, and the magnetization M2 of the fixed layer C2 is fixed upward.

A write-in for the recording layer A is executed by supplying an electron current such that the current passes across the interface between the fixed layers C1 and C2.

First, as shown in FIG. 2A, electrons passed through the fixed layer C2 with a magnetization M2 come to have a spin of the same direction as the magnetization M2. The electrons flow into the recording layer A to transfer their angular momentum to the recording layer A, thus acting on the magnetization M therein. On the other hand, the magnetization M1 of the fixed layer C1 has the direction opposite to that of M2. For this reason, an electric current of the electrons with the spin of the same direction as the magnetization M2, shown as an upward spin in the figure, enters the fixed layer C1 across the interface between the fixed layer C1 and the intermediate layer B1, being reflected at the interface. The spin of the opposite direction, which the reflected electron has, acts also on the recording layer A. That is, the electrons with the spin of the same direction as the magnetization of the fixed layer C2 act substantially twice as much on the recording layer A. Thus, a twice as much action is acquired. As a result, the write-in for the recording layer A can be executed even with a small current.

FIG. 2B also shows an opposite case where the electron current I is reversed. In this case, the electrons constituting the current I come to have the spin of the direction, shown as the downward spin in this figure, by going through a magnetic influence of the magnetization M1 of the fixed layer C1. This electron spin acts on the magnetization M in the recording layer A. The electrons with the spin of this direction are reflected also at the interface between the second fixed layer C2 having the direction of the magnetization opposite to the electron spin and the intermediate layer B2. Then the electron spin acts on the magnetization M of the recording layer A one more time. Thus, the write-in current for the recording layer A can be reduced.

An explanation is going on with returning to FIG. 1 again. The multilayer S as shown in FIG. 1 is made by patterning methods, such as ion milling or RIE (Reactive Ion Etching), while the sidewall of the multilayer S is damaged by an exposure to ion or plasma during patterning, and the damage zone 7 is provided thereto. In damage zone 7, crystalline defects are yielded; crystallinity decreases; oxygen and/or other impurities are contained, for example.

Such damages lower the magnetic anisotropy of the fixed layers made of highly anisotropic materials. Then, the layers approach soft magnetic materials because of the damages. That is, the damage zone 7 becomes soft magnetically. As a result, the coercive forces of the fixed layers C1 and C2 lower, as described in full detail later. The sectional areas are different from each other for the fixed layers C1 and C2. Then, the volume ratio of the damage zone 7 in the fixed layers C1 differs from that in fixed layer C2.

Here, note that the cross-section area at a thickness midpoint 8 (at each half point of the film thicknesses of the fixed layers C1 and C2) is used as each area of cross-section taken parallel to the surface of the fixed layers C1 and C2.

The cross-section area of the fixed layer C2 is smaller than that of the fixed layer C1. The depth profile of the damage zone 7 from the sidewall surface is mostly the same both for the fixed layers C1 and C2. The depth profile of the damage zone 7 is defined to be the depth profiled in a direction substantially perpendicular to the laminating direction of the multilayer S. Accordingly, the volume ratio of the damage zone 7 in the fixed layer C2 is larger than that in the fixed layer C1. As a result, the coercive force of the fixed layer C2 becomes smaller than that of the fixed layer C1.

Providing the multilayer S tapered from the bottom layer to the top layer makes smaller the cross-section area of the layer C2 than that of the layer C1. In addition, the damage zone 7 of the sidewall of the multilayer S tapered can provide a difference between the coercive forces of the fixed layers C1 and C2. Accordingly, it is possible to fix the magnetizations of the fixed layers C1 and C2 in the directions that are anti-parallel using the coercive force difference mentioned above.

As a ferromagnetic material for the fixed and recording layers, a material having a magnetic characteristic corresponding to the application purpose is appropriately selected from the following materials. For example, an alloy or multilayer containing one or more elements selected from the group of iron (Fe), cobalt (Co), nickel (Ni), manganese (Mn) and chromium (Cr), and one or more elements selected from the group of Pt (platinum), Pd (palladium), Ir (iridium), ruthenium (Ru) and rhodium (Rh) can be used. The alloy or artificial lattice film of CoCr, CoCrTa, FePt, FePtB, Fe/Pt, Co/Pd, Co/Pt or so is exemplified.

It is possible to adjust the anisotropy field $H_{an}$ of the recording layer A also by changing the alloy composition or by the heat treatment for the ordered alloy.

Amorphous alloys of rare earth-transition metals such as TbFeCo and GdFeCo or the multilayer structures such as Co/Pt, etc. may also be employable for the recording layer materials.

A composite material with magnetic particulates precipitated in a nonmagnetic matrix is also employable, as well as a continuous magnetic material, for the fixed and recording layers. $CoCr-SiO_2$ or $FePt-AlO_x$ can be exemplified as a composite material. The shape of the magnetic particulates is cylindrical or globular in these materials exemplified.

When the nonmagnetic matrix is the high resistance oxide materials such as $SiO_x$, $ZnO_x$, and $TiO_x$, the low density write-in current is attainable for the magnetization reversal, because the spin-polarized electron current concentrates to the magnetic particulates to be conductive. Using the same nonmagnetic material as that of the barrier layer makes it easy to control crystallinity and magnetic anisotropy of the particulates.

In order to strengthen the spin-filtering effect for the recording element, a layer comprising the materials listed below is optionally inserted between the fixed layer C1 and the intermediate layer B1 and/or between the intermediate layer B2 and the fixed layer C2.

Either one of the following materials is appropriately selected for the inserted layer for intensifying the spin-filtering effect. For example, "iron (Fe) simple substance", "cobalt (Co) simple substance", "nickel (Ni) simple substance", an "alloy containing at least one element selected from the group consisting of iron (Fe), cobalt (Co), nickel (Ni), manganese (Mn), and chromium (Cr)", an "NiFe-based alloy called permalloy", a "CoNbZr-based alloy, FeTaC-based alloy, CoTaZr-based alloy, FeAlSi-based alloy, FeB-based alloy, or CoFeB-based alloy", or a "Heusler alloy, magnetic semiconductor, or half-metal magnetic oxide (or half-metal magnetic nitride) such as $CrO_2$, $Fe_3O_4$, or $La_{1-x}Sr_xMnO_3$" can be used.

As the "magnetic semiconductor", a material containing at least one of magnetic elements including iron (Fe), cobalt (Co), nickel (Ni), chromium (Cr), and manganese (Mn) and a compound semiconductor or oxide semiconductor can be used. Detailed examples of the magnetic semiconductor are (Ga, Cr)N, (Ga, Mn)N, MnAs, CrAs, (Ga, Cr)As, ZnO:Fe, (Mg, Fe)O.

A material having a magnetic characteristic corresponding to the application purpose can be appropriately selected in this embodiment.

As a material used for the inserted layers, a composite material can be selected as well as a continuous magnetic material. The composite material has a structure formed by segregating or forming fine magnetic particles in a nonmagnetic matrix called a "granular magnetic material".

As a material for the intermediate layers B1 and B2, "copper (Cu) simple substance", "gold (Au) simple substance", "silver (Ag) simple substance", "ruthenium (Ru) simple substance" or an alloy containing one or more elements selected from the group consisting of copper (Cu), gold (Au), silver (Ag), ruthenium (Ru) can be used. Alternatively, an insulator such as an oxide, nitride or fluoride containing one or more elements selected from the group of Mg (magnesium), aluminum (Al), titanium (Ti), tantalum (Ta), cobalt (Co), nickel (Ni), silicon (Si), and iron (Fe). Then a conductive layer may contain impurities such as oxygen, for example. The impurity may form a discontinuous thin film with a high electrical resistance. In the case of an insulating layer, it has pinholes, which can be filled by the material of the fixed layers.

Figure 3:
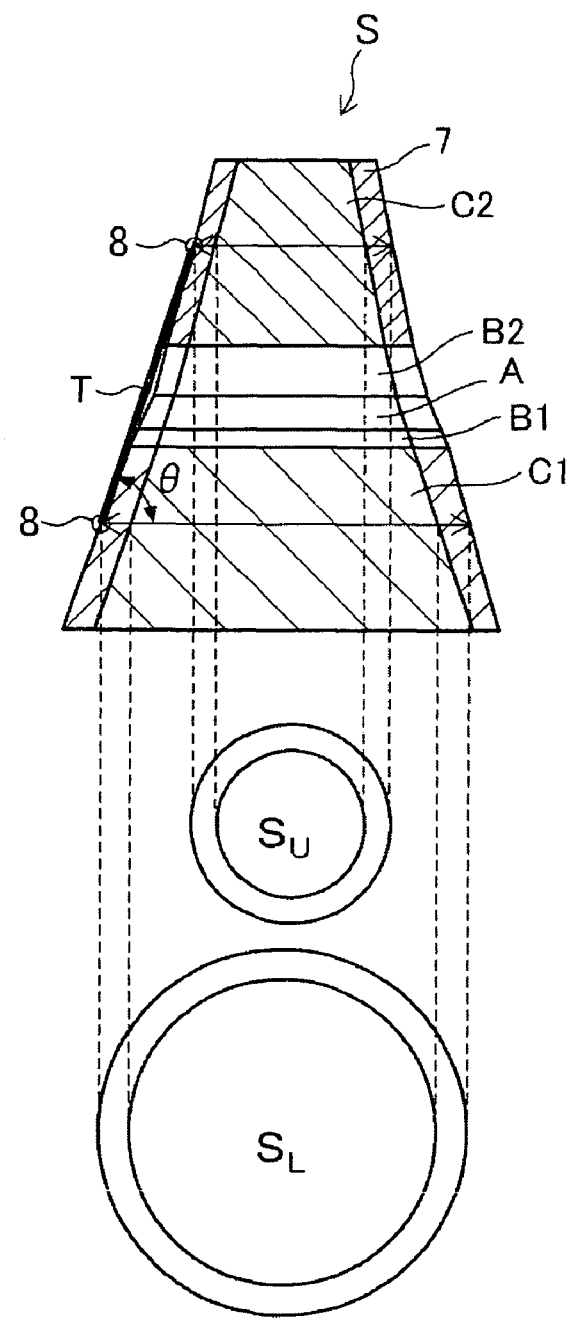
FIG. 3 is a sectional view showing the sectional structure of a magnetic recording element according to the first example of this embodiment.

FIG. 3 is a schematic sectional view showing the multilayer of the recording element according to the first example of this embodiment.

The fixed layer C1, the intermediate layer B1, the recording layer A, the intermediate layer B2 and the fixed layer C2 are sequentially laminated in this order.

The cross section taken perpendicularly to the laminating direction of the fixed layers C1 and C2 is substantially a circle in this example. The multilayer S is formed in a tapered shape, and furthermore the damage zone 7 is introduced to the sidewall of at least one of the fixed layers C1 and C2.

Figure 4:
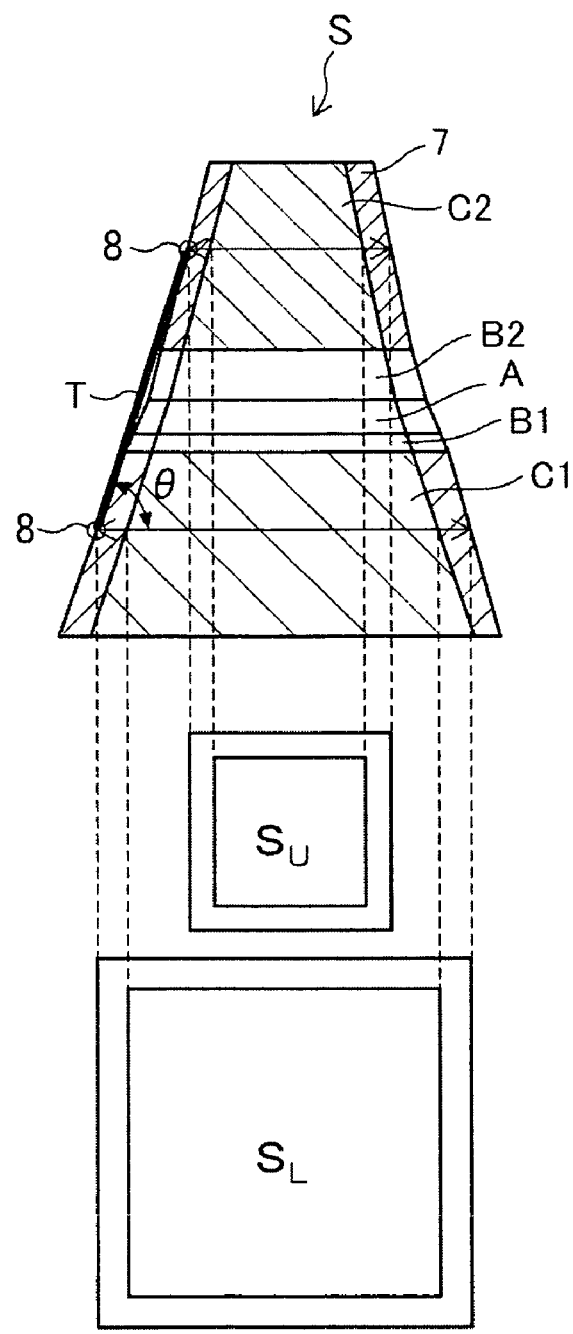
FIG. 4 is a sectional view showing the sectional structure of a magnetic recording element according to the second example of this embodiment.

FIG. 4 is a schematic sectional view showing the multilayer structure of the recording element according to the second example of the present embodiment.

Each layer as mentioned in FIG. 3 is similarly laminated also in this example. However, the cross section taken perpendicularly to the laminating direction is substantially a square for the fixed layers C1 and C2. And the multilayer S is formed in a tapered shape, and furthermore the damage zone 7 is also introduced to the sidewall of at least one of the fixed layers C1 and C2.

As shown in FIGS. 3 and 4, the cross section taken perpendicularly to the laminating direction is a circle or a square for the fixed layers C1 and C2, but the cross section is not limited to these shapes. Besides the cross section described above, the cross section shape can be an ellipse, a polygon, or any shapes other than these, for example.

And it is preferable that the cross section $S_U$ is not more than 70% of the cross section $S_L$ in any of cases mentioned above. The cross sections $S_U$ and $S_L$ are the cross sections taken parallel to the surface at the thickness midpoints 8 and 8 (shown in FIG. 1) of the fixed layer C2 and C1, respectively.

It is, furthermore, preferable that the cross section $S_U$ is set 2000 $nm^2$ or less. These conditions will be described below in more detail with reference to examples.

First, the recording element shown in FIG. 3 is described.

The multilayer S has a 2-nm-thick Ru layer not shown in the figure as an underlayer, a 20-nm-thick FePt layer as the fixed layer C1, a nonmagnetic barrier layer comprising 0.6-nm-thick MgO film as the intermediate layer B1, a 2.4-nm-thick CoCrFe ferromagnetic layer as the recording layer A, a nonmagnetic conductor layer comprising 6-nm-thick Cu film as the intermediate layer B2, a 20-nm-thick FePt layer as the fixed layer C2, and a 3-nm-thick Ta layer as a cap layer not shown in the figure, which are sequentially laminated in this order. The MgO barrier layer and the Cu nonmagnetic conductor layer are to be optionally interchangeable with each other when providing the multilayer S.

This multilayer S is patterned such that its taper angle θ is set about 80 degrees. The cross section taken perpendicularly to the laminating direction at a thickness midpoint between the fixed layers C1 and C2 has a diameter of about 20 nm. The thickness midpoint is actually the thickness midpoint of the multilayer S constituting of the 6-nm-thick Cu, the 2.4-nm-thick CoCrFe and the 0.6-nm-thick MgO. This diameter is defined as the cell diameter of the cell in the 1st example. Here, the multilayer S is referred to as the cell, too. The multilayer S is patterned using an ion milling of an accelerating voltage of 500 V, thereby introducing the damage zones 7 having a depth profile of about 3 nm from the sidewall surface of the fixed layers C1 and C2.

It is estimated from a taper angle of 80 degrees that the fixed layer C1 has a diameter of 29 nm at its undersurface and then the fixed layer C2 has a diameter of 18 nm at its undersurface. Therefore, even if the damage zones 7 have the same depth profile from each sidewall surface of the fixed layers C1 and C2, the volume ratios of the damage zones 7 can differ between these two layers because of the tapered shape of the multilayer S.

Figure 5:
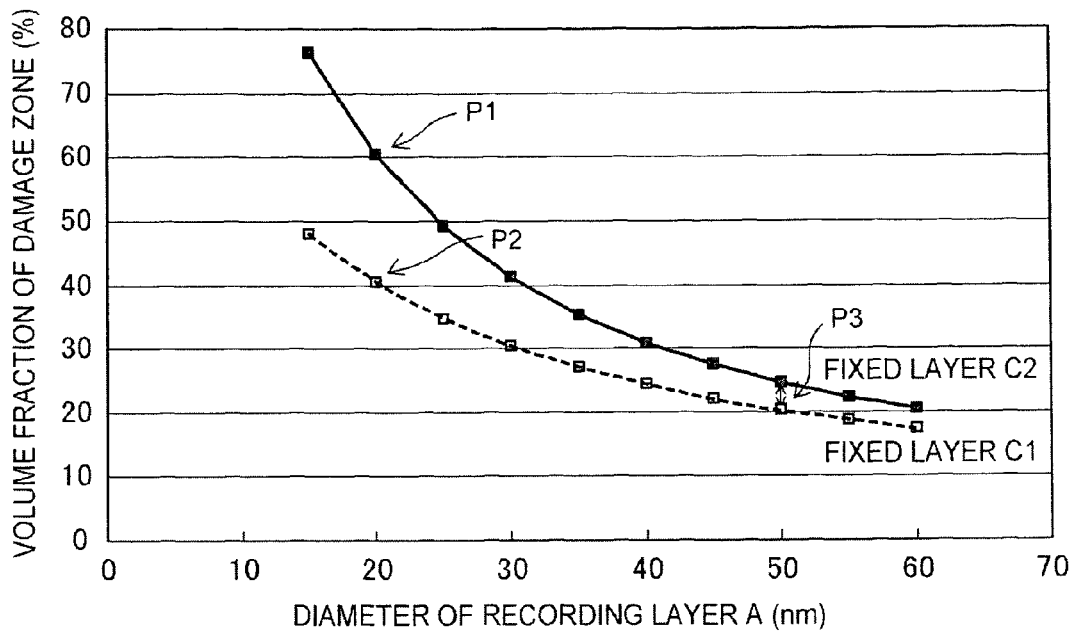
FIG. 5 is a graph showing a change of each volume ratio occupied by the damage zones 7 in the fixed layers with changing the diameter of the recording layer.

FIG. 5 is a graph showing the relationship between each volume ratio of the damage zones 7 in the fixed layers C1 and C2 and the cell diameter. That is, FIG. 5 shows the cell-diameter (nm) dependence of each volume ratio (%) of the damage zones 7. The cell diameter of the multilayer S is defined as the diameter at a thickness midpoint of the recording layer A thereof, equivalent to the average value of the diameter at a thickness midpoint 8 of the fixed layer C1 and the diameter at a thickness midpoint 8 of the fixed layer C2

(shown in FIG. 1) in the first example. In FIG. 5, the horizontal and vertical axes represent the cell diameter and the volume ratios of the fixed layers C1 and C2, respectively.

Assuming that the cross section of the cell (the multilayer S) is a circle, the volume ratio of the damage zone 7 in each fixed layer is calculated using the following formula.

$$\left(\frac{\text{(the volume of damage zone 7)}}{\text{(the whole volume of the fixed layer)}}\right) \times 100(\%)$$

When the depth profile of the damage zone 7 is 3 nm and the cell diameter defined above is 20 nm, the damage zone 7 has a volume ratio of 60% in the fixed layer C2 (shown as P1 in the figure). On the other hand, the damage zone 7 has a volume ratio of 40% in the fixed layer C1 (shown as P2 in the figure). When the volume ratios of the damage zones 7 differ greatly, a degree of the decrease in coercive force greatly differs between the fixed layers C1 and C2.

The taper angle θ is defined in terms of the local surface of the sidewall, thus changing microscopically, as well. Therefore, the taper angle θ is defined as follows. θ is defined as an angle of 90−φ where φ is further defined as an angle that a taper line and a normal do. The taper line T means the line connecting the two midpoints 8 and 8 in the fixed layers C1 and C2, as shown in FIG. 3. The normal is a normal with respect to the surface of the multilayer S. That is, when the fixed layer C1 is the same as the fixed layer C2 in sectional size, the taper angle θ equals 90 degrees.

When the cell is patterned perpendicularly such that θ is 90 degrees, the same volumes of the damage zones 7 are provided to the fixed layers C1 and C2, causing the same degree of the coercive force reduction both for the fixed layers C1 and C2.

On the other hand, the difference is greater between the volume ratios of the damage zones 7 in the fixed layers C1 and C2, as the cell is smaller in size. The volume ratio of the damage zone 7 in the fixed layer C2 becomes greater than that in the fixed layer C1, as the cell is reduced in size with the taper angle kept constant. This is because the damage zones 7 have the same tapered shapes but the different volume ratios both in the fixed layers C1 and C2, provided that the damage zones 7 have the same depth profile. However, the difference mentioned above cannot be acquired just for the perpendicularly fabricated cell. Since the damage zones 7 have the same depth profile in the fixed layers C1 and C2, their volume ratios will be unchanged even though the thicknesses of the fixed layers C1 and C2 increase.

Figure 6:
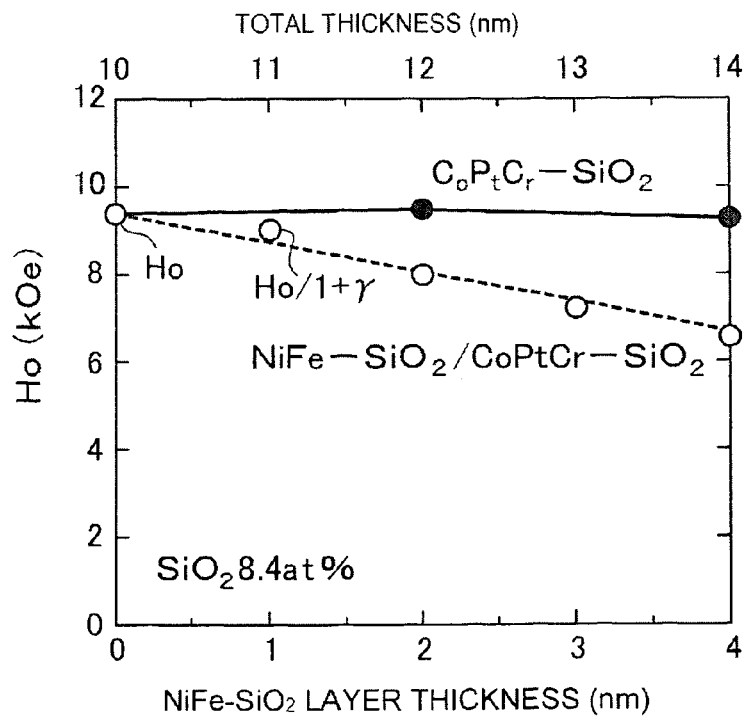
FIG. 6 is a graph showing a decrease in switching fields by means of a double layer of a hard and soft magnetic film.

Making soft magnetic materials contact to the hard ones decreases the latter coercive forces. FIG. 6 is a graph showing the decrease in the switching field of a double layer comprising the hard and soft magnetic films with increasing the thickness of the soft one.

When a hard and soft magnetic materials neighbor to each other to be exchange-coupled, the coercive force of the two materials coupled decreases as a whole in proportion to the volume ratio of the soft magnetic material. The effective anisotropy field $H_k^{eff}$ can be expressed as a following equation (1), where the hard and soft magnetic materials are made to neighbor.

$$H_k^{eff} = H_{ko}(1+\gamma) \quad (1)$$

$H_{ko}$ is the anisotropy field of the whole material where the hard and soft magnetic materials are made not to neighbor. γ is the volume ratio of the soft one to the hard one. A line can mostly approximate the variation of $H_k^{eff}$ with γ in a small range. The effective anisotropy field $H_k^{eff}$ decreases linearly with increasing γ, as shown in the figure. The effective anisotropy field $H_k^{eff}$ corresponds to the coercive force for a single domain material.

FIG. 6 shows the change in $H_o$ for the single-layer and double-layer films with open circles and filled circles, respectively. The single-layer film is a CoPtCr—$SiO_2$, magnetically hard film with a thickness of 10 nm to 14 nm. The double-layer film consists of a 10-nm-thick CoPtCr—$SiO_2$ and magnetically soft NiFe—$SiO_2$ film with a thickness of 4 nm or less on the CoPtCr—$SiO_2$ film for the perpendicular magnetic recording. The figure shows that laminating the soft film onto the hard film reduces $H_o$ corresponding to a switching field on recording. The reduction in $H_o$ reaches about 2 kOe when the NiFe—$SiO_2$ film has a thickness of 3 nm. Then, the thickness ratio of the soft layer film to the whole double layer is about 20%. The decrease in $H_o$ is 1 kOe at a thickness ratio of 10% for the 1-nm-thick soft film. The experimental result described above shows that a thickness ratio of 1% decreases $H_o$ by 100 Oe. Since the soft film is laminated onto the hard film, a film thickness ratio can be replaced with a volume ratio.

In the recording element according to this embodiment, providing a coercive-force difference of 500 Oe between the fixed layers C1 and C2 eases fixing each magnetization direction of the fixed layers. In other words, a volume-ratio difference of 5% between the damage zones 7 in the fixed layers C1 and C2 yields a coercive-force difference of 500 Oe. Even if the damage zones 7 have the same depth profile both in the fixed layers C1 and C2, the fixed layer C2 with a smaller volume will reduce its switching field more than the fixed layer C1.

Returning to FIG. 5 again to explain, it is understood that the cell diameter is about 50 nm when providing a difference of 5% between the volume ratios of the damage zones 7 in the fixed layers C1 and C2.

That is, making the cell diameter about 50 nm or less yields a difference of 5% or more between the volume ratios of the damage zones 7 in the fixed layers C1 and C2. This size will be practical from the view point of the coercive force difference, as shown in the figure as P3. The cross section taken parallel to the surface at a thickness midpoint of the recording layer A is 2000 $nm^2$. The multilayer S has a cross section of 2000 $nm^2$ taken parallel to the surface at a midpoint between two thickness midpoints of the fixed layers C1 and C2. Making the cross section 2000 $nm^2$ or less yields a difference of 5% or more between the volume ratios of the damage zones 7 in the fixed layers C1 and C2.

The depth profile of the damage zone 7 provided by ion milling was observed as follows. When patterning with energy of as low as 250 eV, the depth profiles were observed to be 3 nm to 5 nm and 1 nm to 2 nm for Ni and Ta, respectively. (Ohsawa, J. Magn. Magn. Mat. Vol. 287, 2005, p. 491). Accordingly, a value of 3 nm estimated is appropriate for the depth profile of damage zone 7.

It was also reported that a GdFeCo film sputtered using Kr and Ar had coercivity energy ($M_s \times H_c$) of $5 \times 10^3$ $erg/cm^3$ and $2 \times 10^3$ $erg/cm^3$, respectively. (Uni, et. al., J. Magn. Soc. Jpn., vol. 31, p. 184 (2007)). This result can be understood in terms of the influence of the damage zones 7 on the coercive forces of the fixed layers C1 and C2. Since Ar is easier to be incorporated into the layer film than Kr, using Ar lowers the coercive force of the multilayer S more than using Kr. Gases incorporated into a film are considered to influence the film quality, thus causing the decrease in the coercive force. In addition, direct damages introduced by a high energy beam are also considered to lower the coercive force more significantly. Therefore, providing the damage zones 7 can clearly lower the coercive forces of the fixed layers C1 and C2.

The volume ratios of the damage zones 7 change with the thicknesses of the fixed layers C1 and C2 of the multilayer S tapered.

Figure 7:
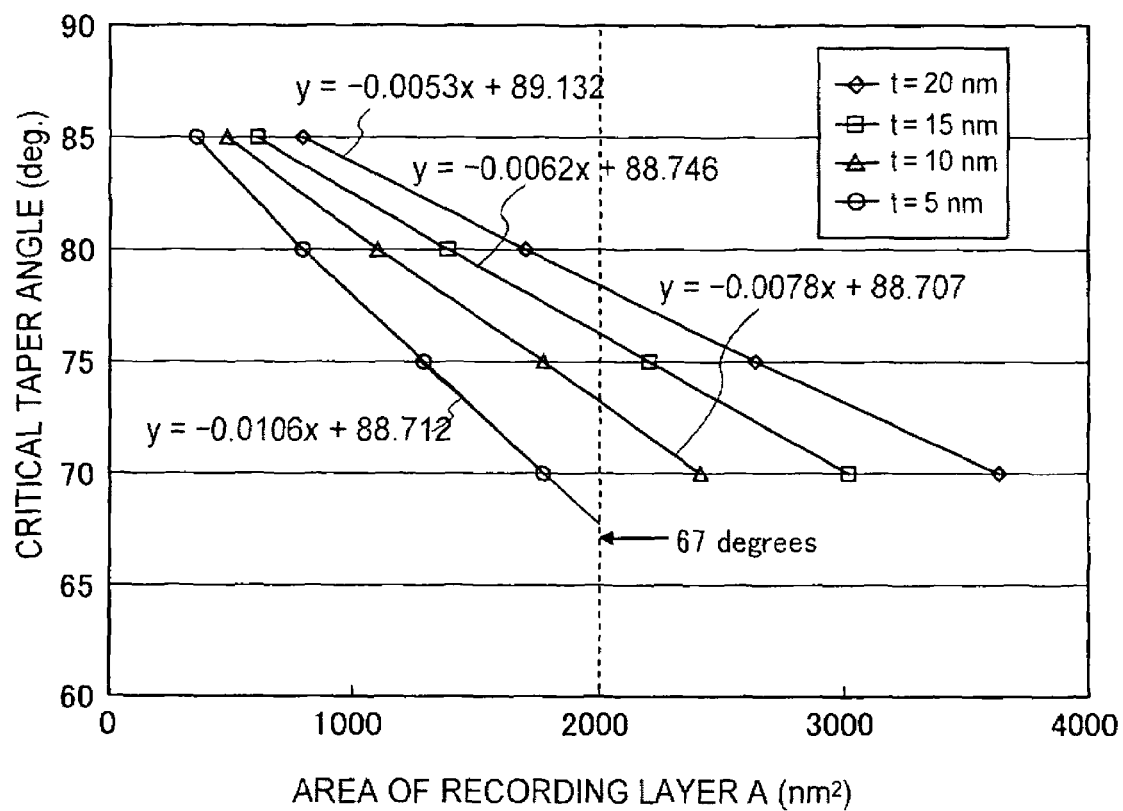
FIG. 7 is a graph showing the taper angle θ versus the area of the recording layer A for providing a difference of 5% between the volume ratios of the damage zones 7 in the fixed layers.

FIG. 7 is a graph showing a critical taper angle $\theta_c$ versus the corresponding area of the recording layer A, where the critical taper angle represented as $\theta_c$ is a taper angle for providing a difference of 5% between the volume ratios of the damage zones 7 in the fixed layers C1 and C2. The horizontal and vertical axes of FIG. 7 represent the area of the recording layer A and the critical taper angle, respectively. The area of the recording layer A is the cross section taken parallel to the surface at a thickness midpoint of the recording layer A. The thickness midpoint of the recording layer A exists in the middle between film-thickness midpoints of the fixed layers C1 and C2. The recording layer A locates at a midpoint of the thickness midpoint of C1 and the thickness midpoint of C2.

An average thickness of the fixed layers C1 and C2 is expressed as a parameter in FIG. 7. Here, the average thickness of the fixed layers C1 and C2 is meant by the average value of the thicknesses of the fixed layers C1 and C2.

It is seen that the critical taper angle $\theta_c$ decreases linearly with the area of the recording layer A. The larger the average thickness of the fixed layers C1 and C2, the milder the decreasing slope. The critical taper angle $\theta_c$ can be expressed as the following equation (2).

$$\theta_c(°) = 90 - 0.001 \times (10 - 0.25t(nm)) S_f(nm^2) \quad (2)$$

Here, t and $S_f$ represent the average thickness of the fixed layers C1 and C2 (nm) and the area (nm$^2$) of the recording layer A, respectively, provided that $\theta_c > 0$.

Providing a taper angle $\theta$ smaller than the critical taper angle $\theta_c$, expressed by the equation (2), with the multilayer S can yield a difference of 5% or more between the volume ratios of the damage zones 7 in the fixed layers C1 and C2.

Next, a lower limit of the taper angle $\theta$ is explained.

For example, a gap length between two adjacent cells is considered to be about 60 nm for an MRAM (Magnetic Random Access Memory) with a storage capacity of 1 Gigabits.

Figure 8:
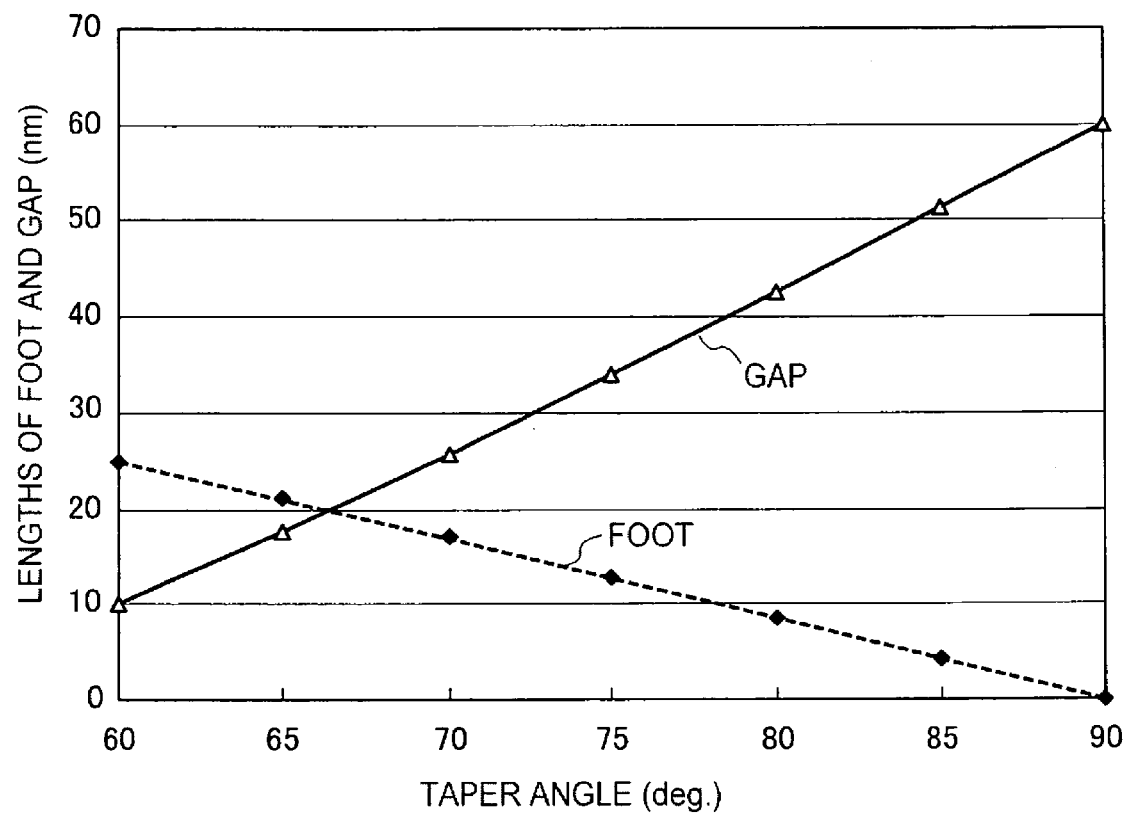
FIG. 8 is a graph showing plots for the lengths of a cell foot and a gap between two adjacent cells with the taper angle θ.

FIG. 8 is a graph showing the lengths of the cell's foot and gap between the cells with respect to the cell's taper angle $\theta$, provided that a cell pitch is 60 nm.

When the taper angle $\theta$ becomes less than 67 degrees, the gap length between two adjacent cells will be less than 20 nm. Making the cell height 50 nm yields a space with as high an aspect-ratio as 2.5 between the cells and causes short-circuits among the cells at a taper angle of about 55 degrees, leading to difficulty of patterning. When the average thickness of the fixed layers C1 and C2 is 5 nm to be a minimum, it is seen from FIG. 7 that $\theta_c$ becomes about 67 degrees at an area of 2000 nm$^2$ for the recording layer A. For these reasons, it is preferable to make the taper angle $\theta$ of the multilayer S larger than 67 degrees.

Next, the advantage of the perpendicular magnetization mode will be explained for this embodiment.

When employing the in-plane magnetization mode for the fixed layers C1, C2 and the recording layer A, the damage zones 7 can more adversely affect the recording properties of the cell with reducing the cell size. On making a hard and soft magnetic materials neighbor to each other, the magnetic energy E of the two materials can be expressed wholly by a term depending on the magnetic anisotropy of the hard material and the Zeeman term as shown in the following equation (3), because the anisotropy energy of the soft magnetic material is negligibly small.

$$E = S\delta \times [K_u \sin^2 \theta M_s H(1-\gamma)\cos(\phi-\theta)] \quad (3)$$

Here, S, $\delta$, $K_u$ and $M_s$ represent the cross section, the thickness, the anisotropy energy and the saturation magnetization of the hard film, respectively; $\theta$ represents an angle between the magnetization and the easy axis; $\gamma$ represents the thickness ratio of the soft film to the hard one; and $\phi$ represents an angle between the easy axis and the magnetic field applied.

Figure 9A:
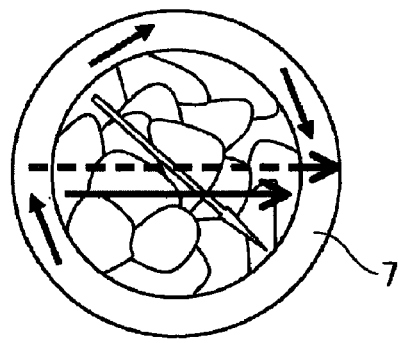
FIGS. 9A and 9B are schematic cross sectional views showing states of the in-plane magnetization and perpendicular magnetization for the hard film, respectively.
Figure 9B:
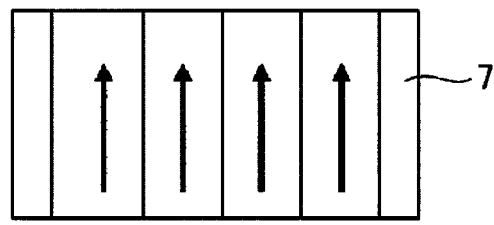

FIGS. 9A and 9B are schematic cross-sectional views showing the states of the in-plane magnetization and perpendicular magnetization modes for the hard film, respectively.

As shown in FIG. 9B, the perpendicular magnetization film with a high coercive force has a large perpendicular magnetic anisotropy in the direction perpendicular to the surface. That is, $K_u$ is large.

On the other hand, as shown in FIG. 9A, the in-plane magnetization film with a high coercive force has an extra freedom degree for various magnetization directions in the film surface with respect to the crystalline grains. That is, the magnetization direction changes easily in the film surface in every crystal grains. In this case, the film cannot have a large $K_u$ in a specific direction. That is, $K_u$ is small as a whole. Hence, the in-plane magnetization film has a lower whole energy than the perpendicular magnetization film having high perpendicular anisotropy energy $K_u$. For example, an in-plane magnetization CoCrTa film has a coercive force of about 2 kOe or less.

Therefore, as shown in FIG. 9A, since the damage zone 7 is softer than the non-damaged inside portion, the damage zone 7 provided to the sidewall begins to turn its magnetization around first, stimulating the inside portion to turn its magnetization around in the fixed layers C1 and C2. The demagnetizing field rotates the magnetization of the damage zone 7 in the circumference direction. This makes the magnetization discontinuous to generate magnetic charges due to the magnetization discontinuity at the interface between the inside portion and damage zone, reducing the effective diameter of the fixed layer to D-2d, where D represents the diameter of the fixed layer and d represents the depth profile of the damage zone, thus increasing the demagnetizing field.

Figure 10:
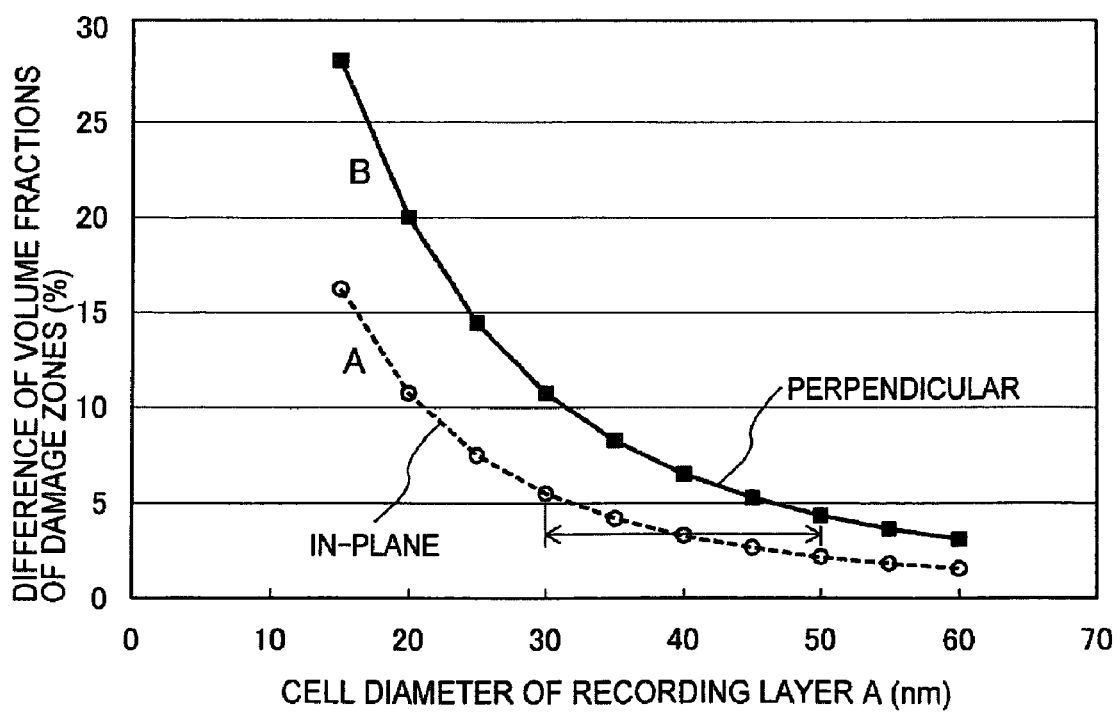
FIG. 10 is a graph showing a comparison between volume ratios of the damage zones of the perpendicular and in-plane magnetization films for the fixed layer.

FIG. 10 is a graph showing a comparison between the perpendicular and in-plane magnetization modes for the fixed layer. Here, the horizontal axis represents the diameter of the recording layer A defined similarly as the horizontal axis of FIG. 5.

The curve A of FIG. 10 shows the change in the difference between the volume ratios of the damage zones 7 in the fixed layers C1 and C2 having a thickness of 5 nm for the in-plane magnetization mode. The cell diameter is deduced from the figure to be about 30 nm at which a difference of 5% or more is provided between the volume ratios of the damage zones 7 in the fixed layers C1 and C2, assuming that the taper angle $\theta$ is set to 80 degrees. However, providing the damage zone 7 with a depth profile of 3 nm from the sidewall surface rotates the magnetization of the damage zone 7 in the circumference direction, yielding the magnetically hard disk-shaped area that actually measures 24 nm diametrical by 5 nm thick (FIG. 9A).

The demagnetizing coefficient of the disk is estimated to be about 0.2. Then the demagnetizing field becomes 1.4 kOe assuming $4\pi M = 7000$ Gausses (M is the saturation magnetization), almost the same value as the coercive force measured. This demagnetizing field makes the magnetization direction unstable. The magnetically hard, disk-shaped area is furthermore exchange-coupled with the magnetically softened damage zone 7. Then the magnetization of the magnetically hard, disk-shaped area becomes even more unstable. Accordingly the disk-shaped area cannot work practically any more as a fixed layer. And the demagnetizing field will become larger with increasing the layer thickness.

Therefore, the fixed layers C1 and C2 will not work actually as a fixed layer in the size smaller than a specific cell size for the in-plane magnetization mode. Such a specific cell size is the size where the difference becomes very prominent between the volume ratios of the damage zones 7 in the fixed layers C1 and C2. It is preferable to avoid providing damages designedly with fine cells having a diameter of tens of nm or less from the viewpoint of reliability.

Even when employing a "synthetic fixed layer" consisting essentially of the three layers where the nonmagnetic metal layer of such as Ru sandwiched between the upper and lower magnetic layers whose one is fixed by the antiferromagnetic layer of such as PtMn, the damage zone of the synthetic fixed layer will lose the unidirectional anisotropy and the synthetic property to be intrinsic. Hence, the damage zone of the synthetic fixed layer will also work as a soft layer to tend to rotate its magnetization in the circumference direction. This tendency of magnetization rotation influences the inside portion having the unidirectional anisotropy such that its magnetization rotates like a chain reaction, thus destabilizing the direction of the in-plane magnetization to be fixed intrinsically.

On the other hand, the curve B of FIG. 10 shows the difference between the volume ratios of the damage zones 7 in the fixed layers C1 and C2, when magnetizing perpendicularly the fixed layers C1 and C2 having a thickness of 20 nm. The cell diameter where the difference between the volume ratios of the damage zones 7 in the fixed layers C1 and C2 exceeds 5% is deduced to be about 50 nm from the figure, provided that the taper angle θ is 80 degrees. In the perpendicular magnetization mode, as described above in FIG. 9B, a high coercive force film has a large perpendicular magnetic anisotropy in the direction perpendicular to the surface. That is, $K_u$ of the high coercive force film is large in general. Therefore, even if the damage zone 7 is provided to surround the inside portion having a high coercive force and is softened magnetically, the magnetization of the inside portion is still stable and is not influenced by the damage zone 7. That is, the perpendicularly magnetized inside portion can work as a fixed layer. When the cell becomes 50 nm or less in diameter, the difference between the volume ratios of the damage zones 7 in the fixed layers C1 and C2 exceeds 5%. That is, the perpendicular magnetization mode may make more significant the difference between the coercive forces of the fixed layers C1 and C2 than the in-plane magnetization mode, additionally even at a larger cell diameter.

An advantageous effect of the invention has been shown by the continuously tapered cells in the examples described above.

However, more advantageous effects can be shown by a cell whose taper is changed discontinuously from its bottom to top layer.

FIGS. 11A through 11D are schematic cross-sectional views exemplifying the cells whose cross-sectional shapes are changed discontinuously from its bottom to top layer.

Figure 11A:
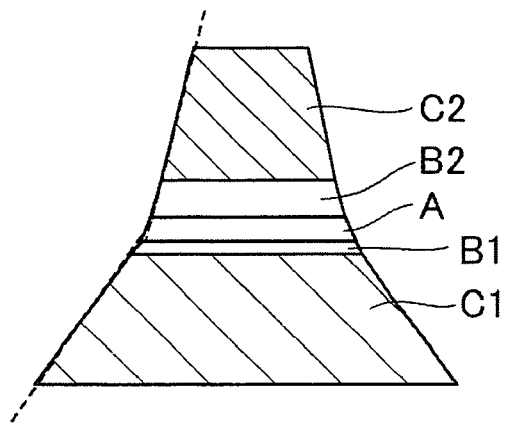
FIGS. 11A through 11D are schematic cross-sectional views exemplifying the cells with their cross-sectional shapes changed discontinuously from their bottom to top layer.

For example, as shown in FIG. 11A, it is possible to pattern the cell approximately with the same diameter or the same taper angle from the upper fixed layer C2 to the recording layer A and then with the discontinuously larger diameter from the intermediate layer B1 to the bottom fixed layer C1. That is, the more advantageous effect can be obtained for the cell patterned with inflection points of the taper between the upper fixed layer C2 and the lower fixed layer C1.

Such a discontinuously tapered cell can be obtained by means of changing the ion milling angle on the way of the ion milling, for example. More specifically describing, the discontinuously tapered cell can be obtained as follows. Conducting ion milling from the upper fixed layer C2 down to the recording layer A to provide a taper angle θ of about 80 degrees is followed by changing the ion milling angle into 60 degrees to conduct ion milling from the intermediate layer B1 down to the bottom fixed layer C1. The timing for changing the ion milling angle can be determined by the terminal point of the recording layer A with an end-point detector equipped in the ion-milling apparatus. Such a method can provide the upper fixed layer C2 with a taper angle of 80 degrees and the rest with a taper angle of 45 degrees, for example.

Thus, patterning the multilayer S in a shape tapered discontinuously from its bottom layer to its top layer can increase a difference between the volume ratios of the damage zones 7 in the fixed layers C1 and C2. The upper fixed layer C2 with a diameter of 20 nm leads to a diameter of about 45 nm for the lower fixed layer. Then the difference increases up to 35% between the volume ratios of the damage zones 7 in the fixed layers C1 and C2. The difference is only 22% when patterning the multilayer S with a constant taper angle of 80 degrees.

The cell with a taper angle of 90 degrees will be explained below.

Figure 12:
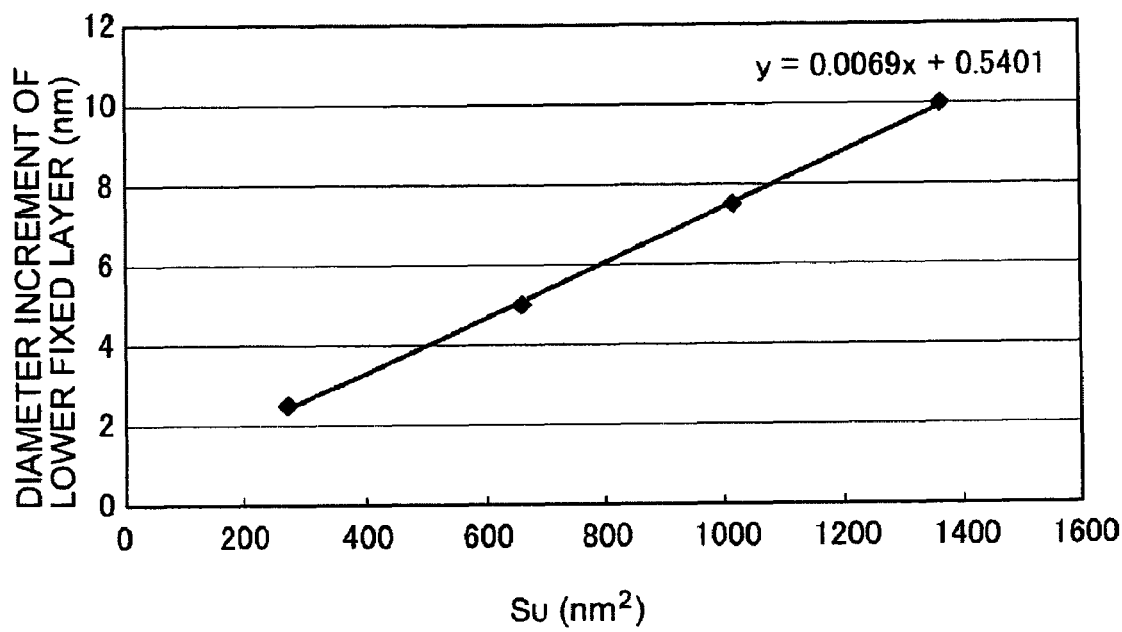
FIG. 12 is a graph showing a straight line meeting a requirement that a difference of 5% should be provided between the volume ratios of the damage zones in the fixed layers.

FIG. 12 is a graph showing a line meeting the requirement that a difference of 5% should be provided between the volume ratios of the damage zones 7 in the fixed layers C1 and C2. In FIG. 12, the horizontal axis represents the area of the upper fixed layer C2 and the vertical axis represents the increment of the diameter of the lower fixed layer C1 (with respect to that of the upper fixed layer C2) to ensure the difference to be 5%.

Representing the increment of the diameter of the lower fixed layer C1 as dD, the relationship shown in FIG. 12 can be expressed as the following equation (4).

$$dD[\text{nm}]=0.007S+0.5 \tag{4}$$

Here, S represents the area of the fixed layer C2 by $nm^2$.

Therefore, the following equation (5) can express the critical diameter DL of the lower fixed layer C1 which includes the increment.

$$DL[\text{nm}]=(\text{the diameter of the fixed layer } C2)+0.007S+0.5 \tag{5}$$

Figure 13:
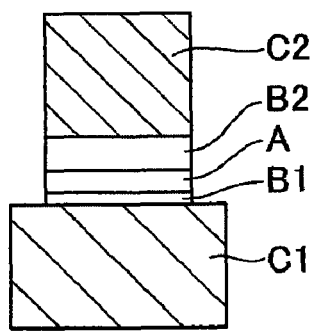
FIG. 13 shows a cell structure whose sidewalls are tapered almost vertically in upper and lower fixed layers.

That is, if the diameter of the lower fixed layer C1 is larger than DL, the difference between the volume ratios of the damage zones 7 in the fixed layers C1 and C2 will exceed 5%. Here, the equation (5) is derived from the calculation result for a taper angle θ of 90 degrees, as shown in FIG. 13. The critical diameter DL can be smaller for the cells tapered.

By the way, magnetic charges are generated on the circumferential sidewall surface of the lower fixed layer C1 in the in-plane magnetization mode. Making larger the diameter of the fixed layer C1 leads to decreasing a magnetic stray field intruding into the recording layer A from the circumferential sidewall surface. This reduces the magnetic bias of the recording layer A, too.

However, magnetic charges are generated on the top surface of the lower fixed layer C1 to generate the stray filed in the perpendicular magnetization mode. The stray field intrudes into the recording layer A to make asymmetric the write-in current density over positive/negative directions for the magnetization reversal of the recording layer A. It is, therefore, preferable to make no difference between the areas of the lower fixed layer C1 and the recording layer A to reduce the stray field from the former into the latter. It is also preferable to determine an optimum area of the lower fixed layer C1 to meet the following two requirements to be optimized.

One is to increase the difference between the volume ratios of the damage zones 7 in the fixed layers C1 and C2. The other is to decrease the surface magnetic charges to be generated on the upper surface of the lower fixed layer C1.

A means to optimize the two requirements is to set inflection points of the taper of the cell between the upper and lower fixed layers C1 and C2, increasing the layer diameter of the fixed layer C1 gradually within its thickness. FIGS. 11A through 11D show several examples of the cells with the inflection points of their taper.

A FIG. 11A show a sectional structure where the taper angle changes at the inflection point, and becomes low under the point.

Figure 11B:
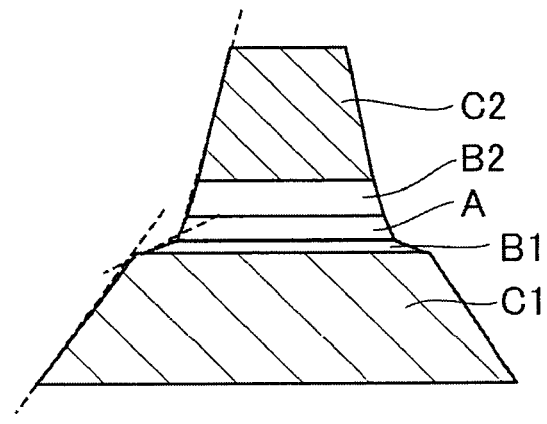

FIG. 11B shows a sectional structure with two inflection points between the upper and lower fixed layers C1 and C2. That is, the cell is expanded in diameter or width from the upper fixed layer C2 to the first inflection point, and then expanded furthermore with the taper angle smaller (deeply) from the first to second inflection point. The taper angle becomes intermediate under the second inflection point to define the diameter of the lower fixed layer C1. The taper angle of the upper fixed layer C2 is larger than that of the lower fixed layer C1.

Figure 11C:
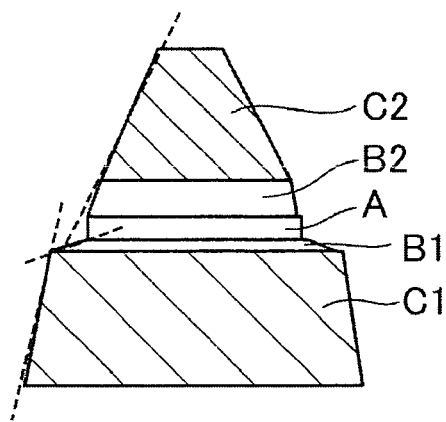

FIG. 11C shows the reverse case where the taper angle of the upper fixed layer C2 is smaller than that of the lower fixed layer C1.

Figure 11D:
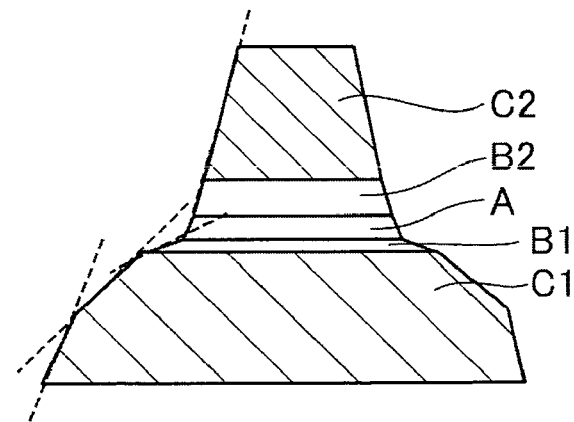

FIG. 11D shows the cell with one more inflection point even on the lower fixed layer C1, and also shows a typical structure where the size of the lower fixed layer C1 can be defined more clearly.

On the other hand, FIG. 13 shows the cell structure whose sidewalls are tapered almost vertically in the upper and lower fixed layers C2 and C1. This structure has the same effect as described above, too.

Figure 14:
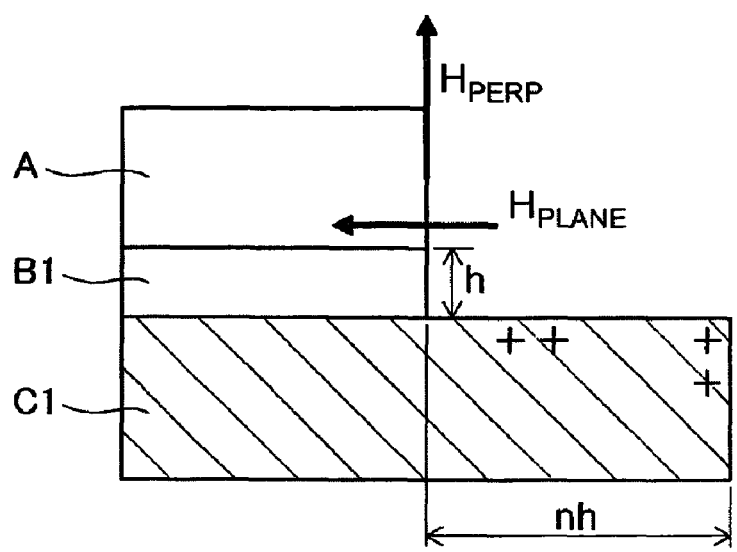
FIG. 14 is a schematic section view showing an exposed portion of the surface of the lower fixed layer, where h represents a distance between the recording and fixed layers.

As shown in FIG. 14, when h represents the perpendicular distance between the recording layer A and the fixed layer C1, 3 h or less is preferable for the width of the exposed surface portion of the lower fixed layer C1. Note that h corresponds to the thickness of the intermediate layer B1. The grounds are explained below while referring to FIG. 15.

In the perpendicular magnetization mode, the stray field is generated from magnetic charges generated on the surface of the exposed portion of the lower fixed layer C1. The stray field is applied parallel to the recording layer A through its sidewall. This stray field acts as the magnetic bias for the recording layer A. Since the stray field causes an asymmetry over positive/negative current for the magnetization reversal on recording, it is preferable to reduce the surface magnetic charges.

Figure 15:
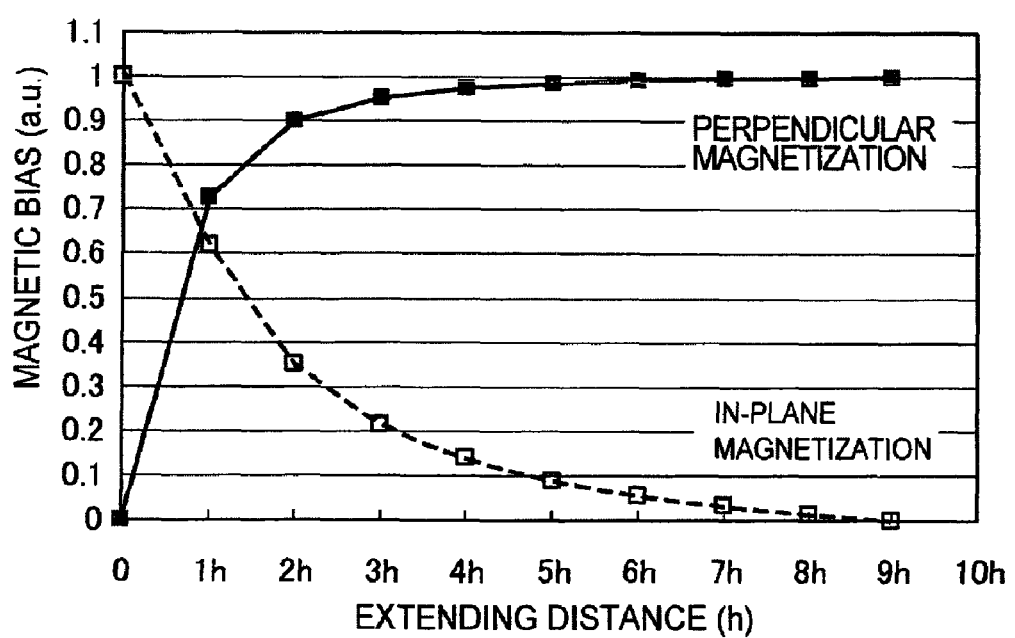
FIG. 15 is a graph showing a magnitude of a magnetic bias at a sidewall of the recording layer, generated by the exposed portion of the lower fixed layer.

FIG. 15 is a graph showing the relationship between the magnitude of the magnetic bias at the sidewall of the recording layer A and the length of the exposed portion of the lower fixed layer C1. The length of the exposed portion extending parallel to the surface will be referred to as "the extending distance" below. The horizontal axis represents the extending distance in FIG. 15. The vertical axis represents the magnetic bias which is normalized by a maximum magnetic bias due to magnetic charges generated on the entire surface of the infinitely long exposed portion of the fixed layer C1 for the perpendicular magnetization mode. Here, the thickness of the fixed layer C1 is set to be zero for simplicity.

It is seen in FIG. 15 that the magnetic bias at the sidewall of the recording layer A becomes small rapidly with reducing the extending distance. In comparison with the extending distance long infinitely, setting the extending distance to 3 h can reduce the magnetic bias by about 5%. Furthermore, setting the extending distance to 1 h can reduce the magnetic bias by 25%. That is, making smaller the extending distance is advantageous to reduce the magnetic bias in the perpendicular magnetization mode.

On the other hand, in the in-plane magnetization mode magnetic charges are generated on the sidewall surface of the fixed layer C1. Therefore, the longer the extending distance, the smaller the magnetic bias. The magnetic bias is normalized for the in-plane magnetization mode by a maximum magnetic bias due to magnetic charges generated on the sidewall surface of the fixed layer C1 without the exposed portion.

The perpendicular magnetization mode has an advantage over the in-plane one when making smaller the extending distance from the viewpoint of the symmetry of the write-in current. It is then preferable that the extending distance should be three or less times the thickness of the first intermediate layer B1.

As mentioned above in FIGS. 3 and 4, the feature is summarized for the recording element of this embodiment as follows. It is preferable that the cross section $S_U$ is not more than 70% of the cross section $S_L$, where the cross sections $S_U$ and $S_L$ are defined as the cross sections parallel to the surface at the film-thickness midpoints 8 and 8 (shown in FIG. 1) of the fixed layer C2 and C1, respectively.

As deduced from FIG. 5, it is preferable that the cross section $S_U$ decreases to 2000 nm$^2$ or less.

Setting the conditions as described above can differentiate the coercive force of the lower fixed layer C1 from that of the upper fixed layer C2 optimally not only for the continuously tapered cells as shown in FIGS. 3 and 4 but also for the discontinuously tapered cells as shown in FIGS. 11 and 13.

Figure 16:
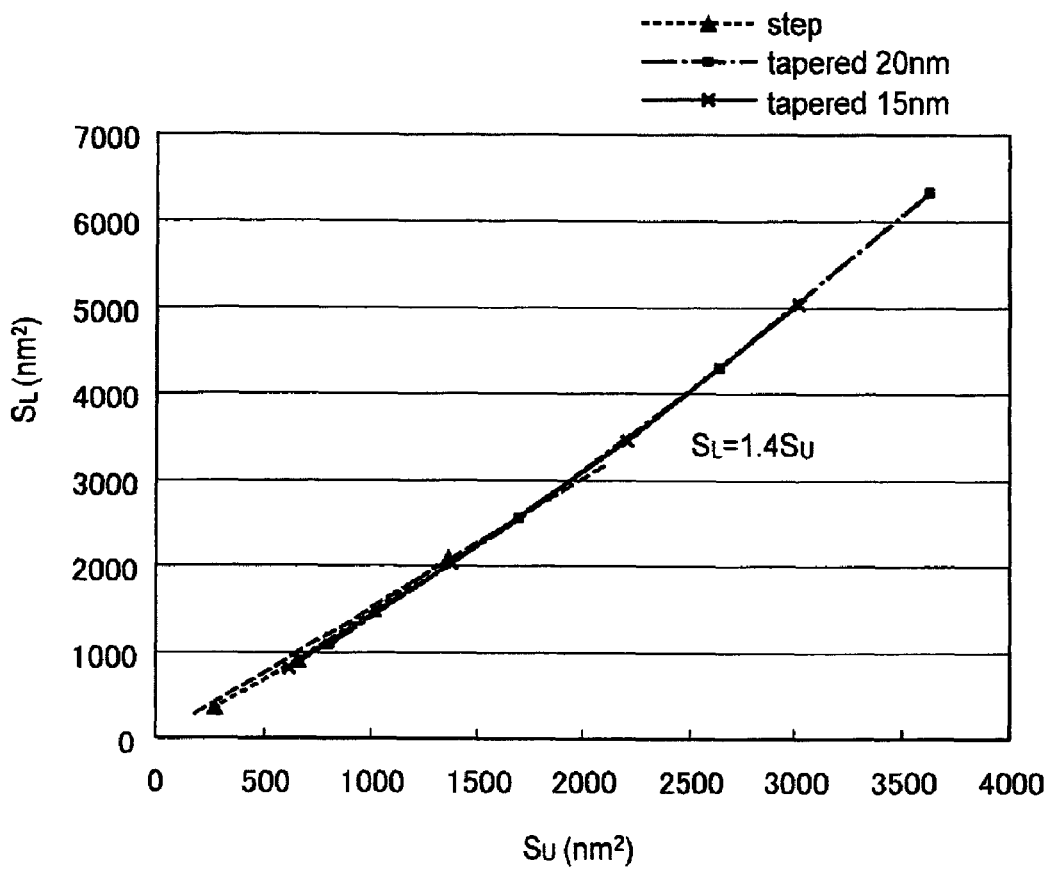
FIG. 16 is a graph showing how a ratio between the areas of the upper and lower fixed layers should be.

FIG. 16 is a graph showing how the ratio of $S_L$ to $S_U$ should be on the basis of the examples described above. Combining all the structures described above yields the following linear approximation equation.

$$S_L = 1.4 \times S_U$$

In other words, it is preferable that the area of the fixed layer C1 is not more than 70% of the area of the fixed layer C2. Fulfilling this condition can differentiate between the coercive forces of the lower and upper fixed layers C1 and C2, providing the production of highly reliable recording elements of this embodiment.

Providing the damage zone 7 with the sidewall of the recording layer A eases its magnetization reversal. That is, providing damages with the sidewall by means of electron beam, ion beam or impurities introduction makes the damage zone magnetically softer than the inside portion. As a result, the outer circumferential zone becomes softer than the rest of the recording layer A. The first magnetization reversal occurs in the magnetically softer damage zone 7 provided to the sidewall of the recording layer A when a spin-polarized current passes through the damage zone 7 to give its torque thereto. Then the magnetization reversal of the damage zone 7 stimulates to reverse magnetizations inside the recording layer A. The damage zone 7 provided eases the magnetization reversal of the recording layer A to lower the critical magnetization-reversal current. Consequently, providing the damage zone 7 leads to power-saving for write-in. In addition, even if the damage zone 7 is oxidized, the high-resistance portion confined to the sidewall surface will not interrupt current-paths. This provides the magnetically softer zone to stimulate the magnetization reversal for the recording layer A without interrupting current-paths for write-in and read-out. In the perpendicular magnetization mode, making thinner the recording layer A increases the demagnetizing field to ease the magnetization reversal with a low current density for write-in while to destabilize the layer thermally, leading to a low recording reliability.

Applying this method to the perpendicular magnetization mode can provide the recording layer A to be relatively thick (larger magnetic volume) to lead to the low write-in current density, balancing the reliability and power-saving of the recording element.

Figure 17:
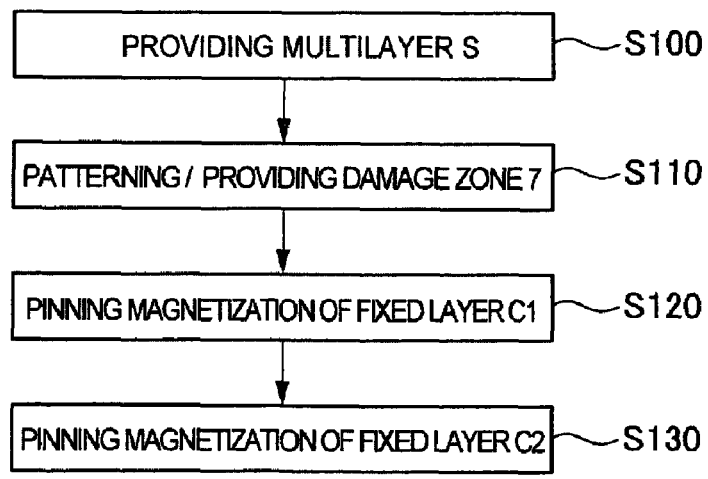
FIGS. 17 and 18 are flow charts showing manufacturing methods of the magnetic recording element of this embodiment.
Figure 18:
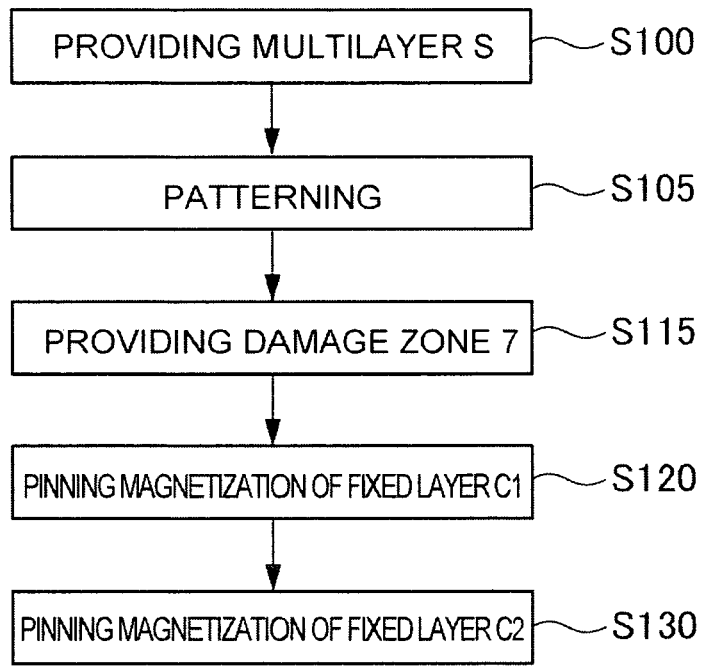

FIGS. 17 and 18 are the flow charts showing the manufacturing process of the recording element of this embodiment.

First, the multilayer S is formed (Step S100). In the first step S100, specifically as described about FIGS. 1 and 3, the fixed layer C1, the intermediate layer B1, the recording layer A, the intermediate layer B2 and the fixed layer C2 are laminated serially on a substrate with interconnects and switching devices prepared, providing the multilayer S consisting essentially thereof.

Next, the multilayer S is patterned (Step S110 shown in FIG. 17). In patterning, the damage zone 7 is provided to the sidewall of the fixed layers C1 and/or C2. For example, the ion-milling or RIE is used for patterning the multilayer S to cause the damage zone 7. The damage zone 7 caused in this manner is magnetically softer than the inside portion of the multilayer S.

As shown in FIG. 18, patterning the multilayer S (Step S105) and providing the damage zone 7 (Step S115) can be made independently. A wet-etching method can pattern the multilayer S in a mesa shape, in an inverted mesa shape or in a step shape shown in FIG. 13. Then using plasma, radicals, ion or electron beam provides the sidewall of the fixed layer C1 and/or C2 of the multilayer S patterned with the damage zone 7. The other means includes oxidation, nitriding, carbonization and fluoridation treatments for the fixed layer C1 and/or the fixed layer C2 with various gases. Gas impurities incorporated into the layers in patterning may also have the same effect as the damage zone provided.

The next step is to fix the magnetization of the fixed layer C1 having a larger coercive force (Step S120). That is, a first magnetic field is applied to the multilayer S in a first direction to fix the magnetization of the fixed layer C1.

Next, fixing is made for the magnetization of the fixed layer C2 having a smaller coercive force (Step S130). Then a second magnetic field is applied to the multilayer S in a second direction opposite to the first direction. The second magnetic field applied has the magnitude smaller than that of the first magnetic field. Therefore, the second magnetic field may not reverse the magnetization of the fixed layer C1. Thus, the essential portion of the recording element of this embodiment is completed.

After that, filling in trenches or gaps yielded among fabricated cells with insulators, for example, and providing the upper interconnect layer, as shown in FIG. 1, complete a magnetic storage system.

As described above, providing a significant difference between the coercive forces of the layers C1 and C2 is so easy that it is also easy to fix the magnetizations of the layers C1 and C2 in the directions anti-parallel, according to this embodiment. Even when the same magnetic material is employed in particular for the fixed layers C1 and C2, these magnetizations are also easily fixed in the anti-parallel state. As a result, sputtering, vapor deposition and Chemical Vapor Deposition with a single target or material can be employed to form the fixed layers C1 and C2.

It is also effective to provide a difference between the depth profiles of the damage zones 7 from the sidewall surfaces of the fixed layers C1 and C2, in the step S110 of FIG. 17 or S115 of FIG. 18.

Figure 19:
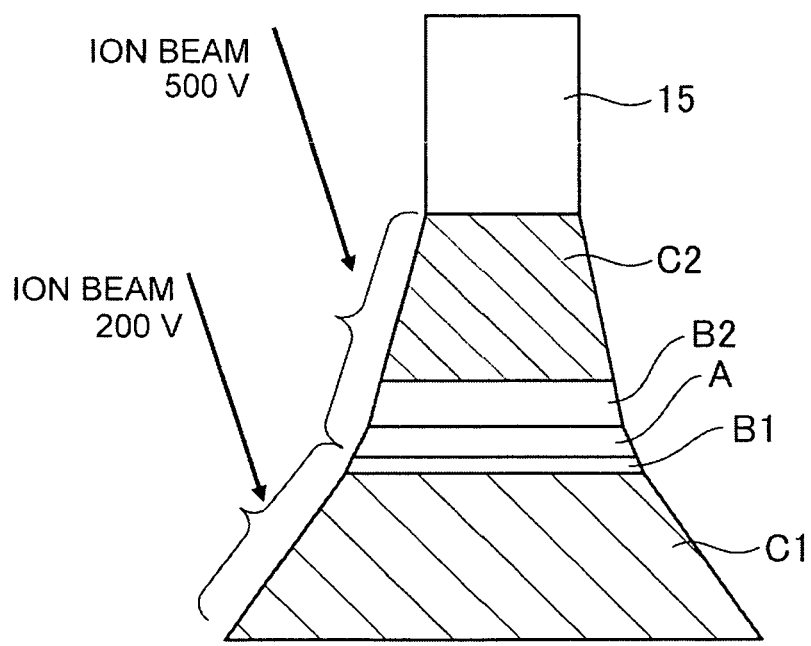
FIG. 19 is a schematic view for explaining how to provide a difference between depth profiles of the damage zones in the fixed layers.

FIG. 19 is a schematic view for explaining how to provide a difference between depth profiles of the damage zones 7 in the fixed layers C1 and C2 under a mask 15.

An example is shown for a method to pattern the fixed layers C1 and C2 with low and high energies, respectively. This patterning makes deeper the damage zone 7 in the fixed layer C2 than that in the fixed layer C1.

Accordingly this patterning can provide a larger difference between the coercive forces with the two fixed layers made thinner or the cells tapered almost perpendicularly. For example, the fixed layer C2 is fabricated with an acceleration voltage of 500 V while the fixed layer C1 is fabricated with an acceleration voltage of 200 V. This can provide a difference of twice as much between the depth profiles of the damage zones in the fixed layers C1 and C2.

The coercive force of the fixed layer C2 with a small area has been explained to be smaller than that of the fixed layer C1 with a large area as a priori assumption. However, the method shown in FIG. 19 can reverse this relationship between coercive forces of the fixed layers C1 and C2. That is, according to the method, a lower and higher coercive force can be provided to the fixed layers C1 and C2 having a larger and smaller area, respectively. As a result, it can also expand a process window for the fabrication.

The recording elements of this embodiment are fine and have a function of the magnetization reversal to be supplied to various applications. Next, a magnetic storage system with the recording elements arrayed is explained as one of the applications of the invention.

Figure 20:
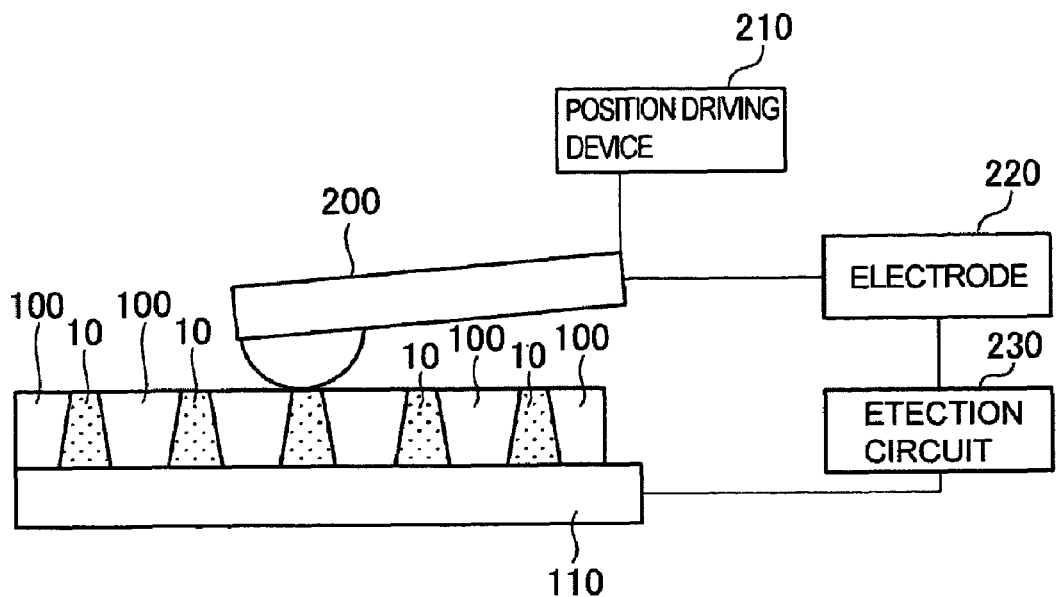
FIG. 20 is a schematic view showing a magnetic storage device with the recording elements of this embodiment.

FIG. 20 is a schematic view showing a magnetic storage system comprising the recording elements of this embodiment. That is, the illustrative example is a probe storage device with a probe accessible to the recording elements of this embodiment to be applied to what is called a "patterned medium."

A plurality of recording elements 10 according to the embodiment are arrayed in a matrix state in a high-resistance insulator layer 100 on a conductive substrate 110 of the recording medium. The example also has a probe 200 for selecting the recording element 10, a position driving device 210 for controlling the relative positional relationship between the probe 200 and the surface of the medium 100, a power supply 220 for applying an electric current or voltage from the probe 200 to the recording element 10, and a detection circuit 230 for detecting the internal magnetization state of the recording element 10 as a change in electrical resistance.

The position driving device 210, as shown in FIG. 20, is connected to the probe 200 to change the position of the probe 200. The position driving device 210 only needs to control the relative position between the medium 120 and the probe 200. Hence, the position driving device 210 may be connected to, e.g., the side of the medium. The write-in or read-out is done by supplying an electric current between the probe 200 and the substrate 110 through the recording element 10 for the patterned medium where a plurality of recording elements 10 are arrayed on a conductive substrate 110 as shown in the figure.

The recording element 10 is selected by changing the relative positional relationship between the probe 200 and the medium. The probe 200 only needs to be electrically connected to the recording element 10. Hence, the probe 200 can be either in contact with the recording element 10 or in a noncontact state. In the noncontact state, the write-in or read-out can be executed by using a tunnel current which flows between the recording element 10 and the probe 200 or an electric current by field emission.

Figure 21:
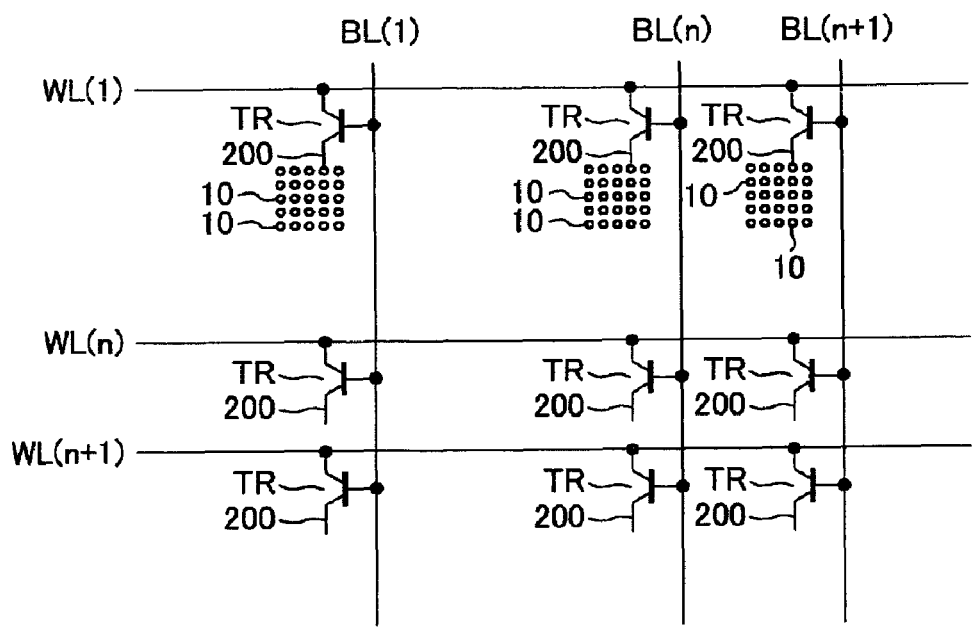
FIG. 21 is a schematic view showing a magnetic storage system with multiple probes.

FIG. 21 is a schematic view showing a magnetic storage system with multiple probes. The recording elements 10 according to the embodiment are arrayed on a substrate to form a 32×32 matrix.

In addition, 32×32 sets of the matrices are arrayed to form a 1-Mbit recording/playback medium. The write-in or read-out is done for the recording/playback medium by using 32×32 probes. That is, one probe 200 corresponds to one set of matrix in the magnetic storage system of this embodiment.

Probing is the same as described above with reference to FIG. 21. The recording element for each probe 200 can be selected by an X-Y driving mechanism arranged in the medium. If the positional relationship relatively changes, the recording element may be selected by a driving mechanism arranged in the probe 200. Since the probes 200 themselves form multiple probes, each probe may be connected to the so-called word line WL and bit line BL and selected by selecting the word line WL and bit line BL. The write-in and read-out of the recording element 10 are executed by the current injected from the probe 200.

Figure 22:
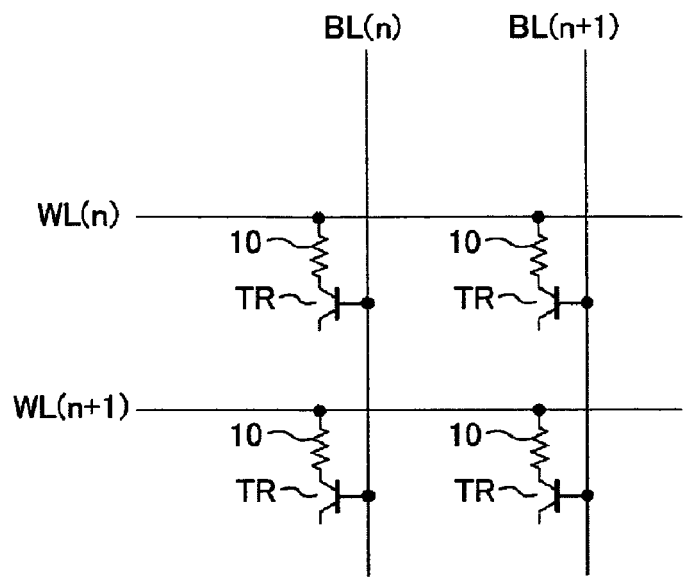
FIG. 22 is a schematic view exemplifying a magnetic storage system with switching elements.

FIG. 22 is a schematic view exemplifying a magnetic storage device with switching elements.

For example, lower bit lines and transistors are prepared on a wafer, and the recording elements 10 are arrayed on the wafer. Then word lines are formed on the wafer with the recording elements 10 arrayed, and the electrodes of the recording elements 10 are connected to the word lines and one of the electrodes of the switching elements. Thus the magnetic storage device is formed as shown in FIG. 22.

The selection of the recording element 10 is available by selecting the word line WL connected to the recording element and bit line BL connected to the gate of the switching element (the transistor). Selecting the bit line BL to select the transistor to be turned on supplies an electric current to the recording element 10 sandwiched between the word line selected and one of the electrodes of the transistor turned on. The recording is made by supplying the writing current $I_w$ larger than the reversal current $I_s$ to the recording element 10 where $I_s$ is determined from the size, structure and composition etc. of the recording element 10.

Figure 23:
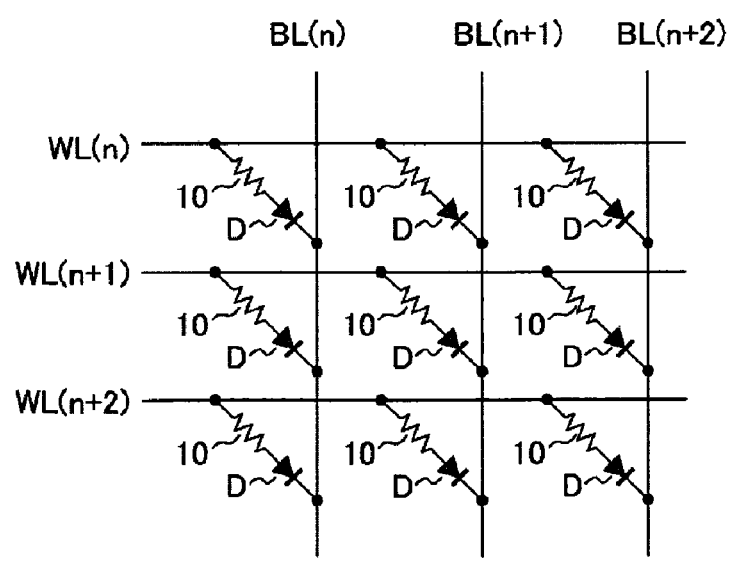
FIG. 23 shows a schematic view of a so-called cross-point memory.
Figure 24:
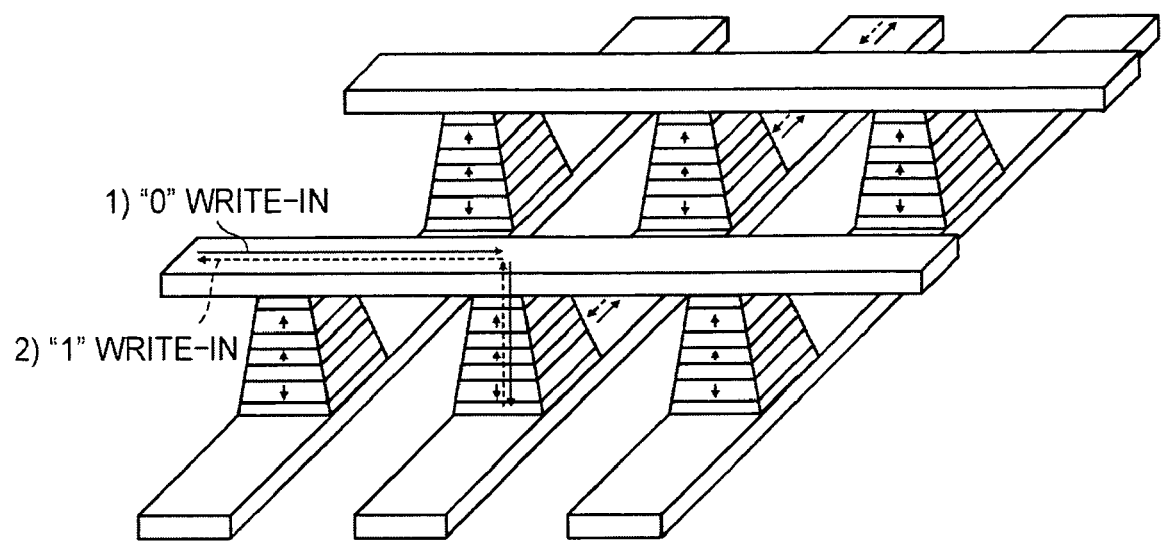
FIG. 24 shows a perspective view of a so-called cross-point memory.

FIGS. 23 and 24 show schematic views of a so-called "cross-point" memory and its perspective view, respectively. For example, lower bit lines and diodes D are prepared on a wafer, and the recording elements 10 are arrayed on the wafer. Then word lines are prepared on the wafer with the recording elements 10 arrayed, and the electrodes of the recording elements 10 are connected to the bit line through the diode D and to the word line, thus providing the magnetic storage device.

The selection of recording element 10 is available by selecting the word line WL and bit line BL connected to the recording element. Then, the diode D controls an electric current such that the current is not supplied to the recording elements 10 unselected.

The embodiments of the present invention have been described above. The present invention is not limited to the embodiments. For example, when those skilled in the art appropriately select to combine two or more of the examples as described above with reference to FIGS. 1 through 24 from a known range, and the same effect as described above can be obtained, they are also incorporated in the present invention. Various changes and modifications can be made without departing from the spirit and scope of the present invention, being also incorporated in the present invention.

What is claimed is:

1. A magnetic recording element comprising a multilayer including a surface and a pair of electrodes, the multilayer including:
   a first magnetic layer whose magnetization is substantially fixed in a first direction substantially perpendicular to the surface;
   a second magnetic layer whose magnetization is substantially fixed in a second direction opposite to the first direction substantially perpendicular to the surface;
   a third magnetic layer provided between the first and the second magnetic layers, a direction of magnetization of the third magnetic layer being variable;
   a first intermediate layer provided between the first and the third magnetic layers; and
   a second intermediate layer provided between the second and the third magnetic layers, wherein the pair of electrodes is capable of supplying an electric current to flow in a direction substantially perpendicular to the surface of the multilayer and the sectional area of the first magnetic layer taken parallel to the surface at a thickness midpoint of the first magnetic layer is larger than the sectional area of the second magnetic layer taken parallel to the surface at a thickness midpoint of the second magnetic layer; and
   wherein at least one of the first magnetic layer and the second magnetic layer includes a sidewall portion magnetically softer than an inside portion thereof.

2. The element according to claim 1, wherein the first and the second magnetic layer include first and second sidewall portions magnetically softer than the inside portion, respectively, and a volume ratio of the first sidewall magnetically softer than the inside portion is different from a volume ratio of the second sidewall portion.

3. The element according to claim 1, wherein the cross section of the second magnetic layer taken parallel to the surface at the thickness midpoint is not more than 70% of the cross section taken parallel to the surface of the first magnetic layer at the thickness midpoint, and a cross section taken parallel to the surface at the midpoint between the two thickness midpoints is 2000 nm$^2$ or less.

4. The element according to claim 1, wherein a side surface of the multilayer has a tapered shape, the side surface having a taper angle of 67 to 85 degrees with respect to the surface.

5. The element according to claim 4, wherein the taper angle is not more than $\theta_c$ that is defined by an equation of $\theta_c$ (degree)=90−0.001×(10−0.25t (nm))×$S_f$(nm$^2$), where t is an average thickness of the first and second magnetic layers and $S_f$(nm$^2$) is a cross section taken parallel to the surface of the third magnetic layer.

6. The element according to claim 4, wherein an inflection point of the taper angle exists between the first and second magnetic layers.

7. The element according to claim 6, wherein the taper has a plurality of inflection points.

8. The element according to claim 1, wherein a portion of the first magnetic layer that extends parallel to the surface from an edge of the third magnetic layer has a length of three times or less a thickness of the first intermediate layer.

9. The element according to claim 1, wherein the taper angle of each side surface of the first and second magnetic layers is 85 degrees or more, and $D_L$, $D_U$ and S satisfy a relationship of $D_L>D_U+0.0075+0.5$, where S (nm$^2$) represents a cross section taken parallel to the surface at the thickness midpoint of the first magnetic layer, $D_L$ (nm) represents a diameter at the thickness midpoint of the first magnetic layer, and $D_U$ (nm) represents a diameter at the thickness midpoint of the second magnetic layer.

10. The element according to claim 1, wherein the third magnetic layer includes a sidewall portion and at least one of the sidewall portions of the first, second and third magnetic layers has a different thickness of the sidewall portion from the thickness of the sidewall portion of the others.

11. The element according to claim 1, wherein the first and second magnetic layers are composed of a same magnetic material, and a coercive force of the first magnetic layer is larger than the coercive force of the second magnetic layer.

12. A magnetic recording element comprising a multilayer including a surface and a pair of electrodes, the multilayer including:
- a first magnetic layer whose magnetization is substantially fixed in a first direction substantially perpendicular to the surface;
- a second magnetic layer whose magnetization is substantially fixed in a second direction opposite to the first direction substantially perpendicular to the surface;
- a third magnetic layer provided between the first and the second magnetic layers, a direction of magnetization of the third magnetic layer being variable;
- a first intermediate layer provided between the first and the third magnetic layers; and
- a second intermediate layer provided between the second and the third magnetic layers, wherein the pair of electrodes is capable of supplying an electric current to flow in a direction substantially perpendicular to the surface of the multilayer and the sectional area of the first magnetic layer taken parallel to the surface at a thickness midpoint of the first magnetic layer is larger than the sectional area of the second magnetic layer taken parallel to the surface at a thickness midpoint of the second magnetic layer; and wherein the third magnetic layer includes a sidewall portion magnetically softer than an inside portion thereof.

* * * * *